United States Patent
Sugawa et al.

[11] Patent Number: 5,886,914
[45] Date of Patent: Mar. 23, 1999

[54] FILTER CIRCUIT WITH REDUCED NUMBER OF DELAY ELEMENTS AND ADDERS

[75] Inventors: Satoshi Sugawa; Shiro Hosotani, both of Tokyo, Japan

[73] Assignee: Mitsubishi Denki Kabushiki Kaisha, Tokyo, Japan

[21] Appl. No.: 892,968

[22] Filed: Jul. 15, 1997

[30] Foreign Application Priority Data

Feb. 21, 1997 [JP] Japan ................................. 9-037684

[51] Int. Cl.⁶ .................................................. G06F 17/10
[52] U.S. Cl. ...................................... 364/724.16; 364/749
[58] Field of Search ........................ 364/724.16, 724.13, 364/749

[56] References Cited

U.S. PATENT DOCUMENTS 4,941,121 7/1990 Zurawski ................................. 364/749
5,530,661 6/1996 Garbe et al. ........................ 364/724.16

FOREIGN PATENT DOCUMENTS 3-145323 6/1991 Japan .

OTHER PUBLICATIONS

IEEE International Solid State Circuits Conference, 1987, "A 40 Mhz Programmable Semi Systolic Transversal Filter", Noll et al., pp. 180–181, 390–391.

IEEE Transactions on Circuits and Systems—II:Analog and Digital Processing, vol. 43., No. 10, Oct. 1996, "Subexpression Sharing in Filters Using Canonic Signed Digit Multipliers", Hartley, pp. 677–688.

*Primary Examiner*—David H. Malzahn
*Attorney, Agent, or Firm*—Burns, Doane, Swecker & Mathis, LLP

[57] ABSTRACT

An output from an adder $10_1$, i.e., an output of a first bit plane is inputted to an adder $10_6$ through delay elements $2_2$ and $3_0$ and a multiplier $100_0$. On the other hand, input data X are inputted to multipliers $C_2^1$ to $C_0^1$ through a delay element $1_0$ and multiplied by the respective multipliers to obtain partial products. An adder $10_2$ receives a partial product by the multiplier $C_2^1$ through a delay element $2_3$ and a partial product by the multiplier $C_1^1$. An adder $10_3$ receives an output from the adder $10_2$ through the delay element $2_3$ and on the other hand a partial product by the multiplier $C_0^1$. An output from the adder $10_3$, i.e., an output of a second bit plane is inputted to the adder $10_6$ through a delay element $2_5$. The adder $10_6$ performs addition of the output from the adder $10_3$, i.e., the output of the second bit plane and the output from the adder $10_1$, i.e., the output of the first bit plane, to output the addition result. This structure allows reduction in the number of delay elements and adders, to achieve a filter circuit downsized in circuit scale.

13 Claims, 17 Drawing Sheets

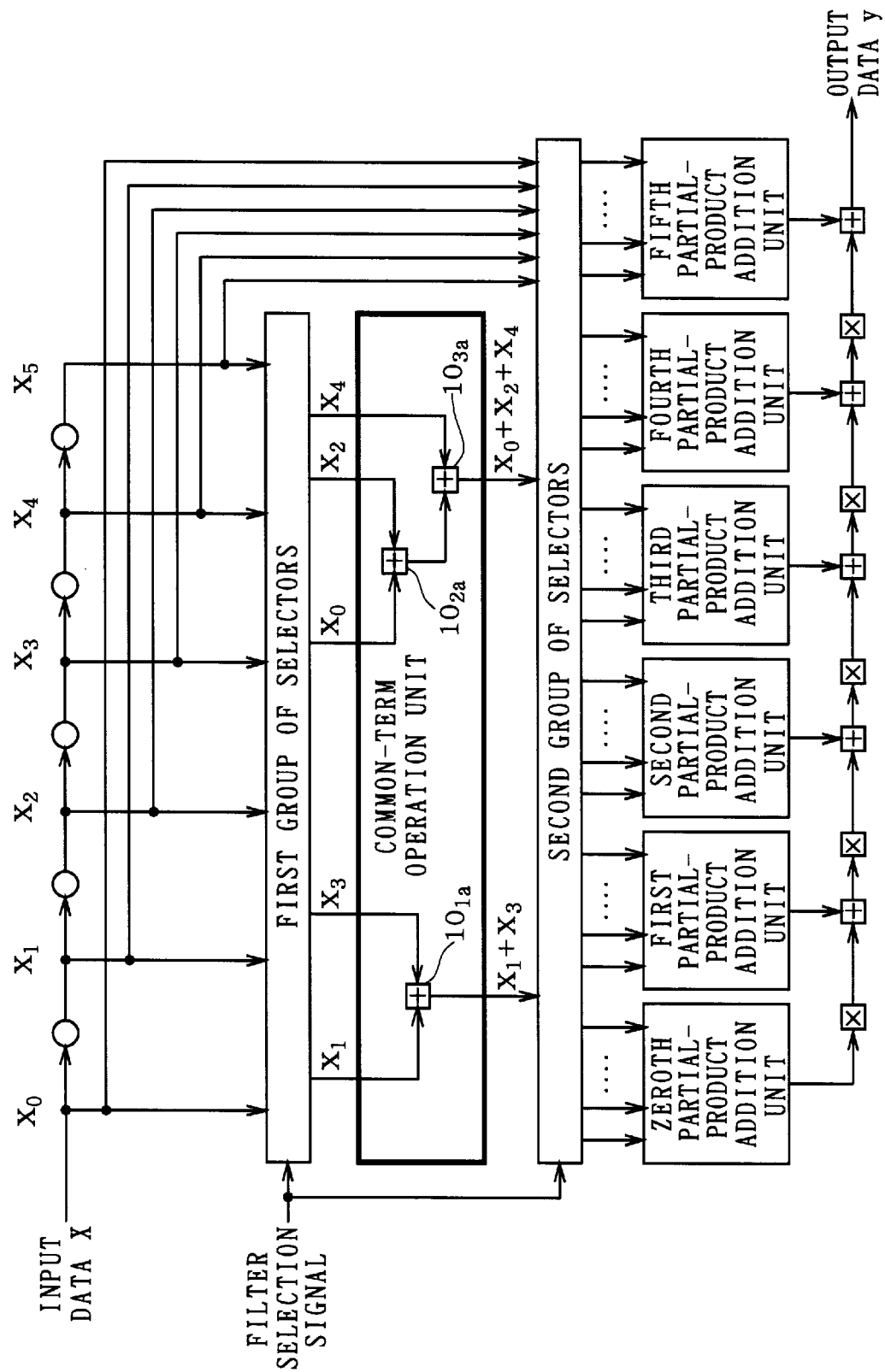
F I G. 1 4

FILTER CIRCUIT WITH REDUCED NUMBER OF DELAY ELEMENTS AND ADDERS

BACKGROUND OF THE INVENTION

1. Field of the Invention

The present invention relates to an GFIR (Finite-duration Impulse-Response) filter circuit having cascaded bit planes, each of which consists of multipliers and adders, to perform a multiply-add operation.

2. Description of the Background Art

A digital filter is a typical semiconductor integrated circuit intended for use in processing digital signals, such as sound, communication and image signals, and has replaced a conventional analog filter, with developments in digital-signal processing techniques, in the fields of communications and consumer products.

In some cases of digital-signal processing with a digital filter, a digital-signal processing circuit is constituted of filter circuits of different characteristics. An example of this digital-signal processing circuit is shown in a block diagram of FIG. 16. A signal to be processed (input data X) is inputted to filter circuits F1 to FL (L: integer, L≧2), and processed therein based on the respective characteristics that the filter circuits F1 to FL have. The processed results are outputted as output data $Y_1$ to $Y_L$ from the respective filter circuits to a selector. The selector selects a desired one out of the output data $Y_1$ to $Y_L$ in response to a filter selection signal, and then outputs the desired one as output data y of the digital-signal processing circuit.

Now, a configuration of the filter circuit will be described. In general, a filter circuit consists of several kinds of filters each having a specific filter coefficient $C_i$ (i: integer, i≧0). The filter coefficient $C_i$ is constituted of a series of 1-bit coefficient components. In this specification, $C_i^j$ (j: integer, j≧0) represents a coefficient component on the (j+1)-th bit from the least significant bit (LSB). For example, the LSB of the filter coefficient $C_i$ is represented as $C_i^0$ and a coefficient component on the second bit from the LSB is represented as $C_i^1$. Furthermore, when m is the maximum value of j, the bit length of filter coefficient is (m+1) bit in this representation.

Specifically, a filter circuit consists of cascaded bit planes, each having a combination of multipliers and adders. Coefficient components of a filter coefficient correspond to respective multipliers used in the multipliers included in a bit plane.

A typical example of an FIR filter circuit having cascaded bit planes is shown in a block diagram of FIG. 17. This figure shows a background-art bit plane structure by Tobias G. Noll ("A 40 MHz Programmable Semi-Systolic Transversal Filter" ISSCC Dig. Tech. Papers, pp. 180–191, Feb. 1987). This exemplary filter circuit employs three filter coefficients $C_0$, $C_1$ and $C_2$ each of three-bit coefficient components. According to the above representation $C_i^j$, the three filter coefficients are represented as $C_0$ {$C_0^2, C_0^1, C_0^0$}, $C_1$ {$C_1^2, C_1^1, C_1^0$} and $C_2$ {$C_2^2, C_2^1, C_2^0$}. Hereafter, a multiplier that multiplies the input data X by the coefficient component is also represented by using the coefficient component.

As can be seen from FIG. 17, this bit plane structure is designed so that the input data X, if processed by multipliers of the same kind of filter coefficient, should be delayed by the same number of delay elements until outputted from the filter circuit, and if processed by multipliers of different kinds of filter coefficients, the input data X processed by a multiplier with coefficient of larger i must be delayed by larger number of delay elements.

For example, the input data X processed by the multiplier $C_0^0$ are outputted through seven delay elements $2_2$, $2_3$, $2_4$, $2_5$, $2_6$, $2_7$ and $2_8$, and similarly the input data X processed by the multiplier $C_0^1$ are outputted through seven delay elements $1_0$, $1_1$, $1_2$, $2_5$, $2_6$, $2_7$ and $2_8$. On the other hand, processed by the multiplier $C_1^0$, the input data X must be delayed by eight delay elements $2_1$, $2_2$, $2_3$, $2_4$, $2_5$, $2_6$, $2_7$ and $2_8$, and the number of delay elements that the input data X go through increases by one as compared with when processed by the multiplier $C_0^0$. Specifically, in the bit plane structure of FIG. 17, the input data X are delayed by seven delay elements when processed by the multiplier $C_0^j$, eight delay elements when processed by the multiplier $C_1^j$, and nine delay elements when processed by the multiplier $C_2^j$ until outputted. The above discussion is based on the premise that the delay elements $1_0$ to $2_8$ should have the same performance.

Now, an operation of the circuit of FIG. 17 will be discussed. In the zeroth bit plane, the input data X to be processed in the filter circuit are inputted to the multipliers $C_2^0$ to $C_0^0$ and multiplied by the respective multipliers, to obtain partial products corresponding to the respective multipliers. An adder $10_0$ receives the partial product by the multiplier $C_2^0$ through the delay element $2_0$ and the partial product by the multiplier $C_1^0$. An adder $10_1$ receives an output from the adder $10_0$ through the delay element $2_1$ and the partial product by the multiplier $C_0^0$, and outputs the addition result as an output of the zeroth bit plane.

The output from the adder $10_1$, i.e., the output of the zeroth bit plane is inputted to a multiplier $100_0$ not included in any bit plane through the delay element $2_2$ also not included in any bit plane. The multiplier $100_0$, which has a multiplier ½, multiplies the data inputted thereto by ½, that is, shifts the data right one bit position and truncates the LSB, and outputs the multiplication result.

On the other hand, the input data X, being delayed by the delay elements $1_0$ to $1_2$ not included in any bit plane, are inputted to the multipliers $C_2^1$ to $C_0^1$ in the first bit plane and multiplied by the respective multipliers to obtain partial products. An adder $10_2$ receives the partial product by the multiplier $C_2^1$ and an output from the multiplier $100_0$. An adder $10_3$ receives an output from the adder $10_2$ through the delay element $2_3$ and the partial product by the multiplier $C_1^1$. An adder $10_4$ receives an output from the adder $10_3$ through the delay element $2_4$ and the partial product by the multiplier $C_0^1$, and outputs the addition result as an output of the first bit plane.

Similar operation is performed in the second bit plane, and then an adder $10_7$ outputs its addition result as the output data Y of the filter circuit.

Furthermore, the background-art bit plane structure of FIG. 17 needs, if the maximum value of i is n, eight ((m+1)(n+1)−1) adders and fifteen ((m+1)(n+1)+m(n+1)) delay elements. The delay elements $1_2$, $1_5$, $2_2$, $2_5$ and $2_8$ are optionally provided to achieve a desired delay time in accordance with the performance of the delay elements, and may be omitted. Considering that, substantially, only ten ((m+1)n+mn) delay elements are needed.

As shown in FIG. 17, a filter circuit needs many delay elements, adders and multipliers in accordance with the number of kinds of the filter coefficient and the number of coefficient components, thus becoming larger in circuit scale. That increases the area of a chip and boosts the manufacturing cost.

In particular, this disadvantage becomes more pronounced in the digital-signal processing circuit employing a plurality of filter circuits as shown in FIG. 16.

SUMMARY OF THE INVENTION

The present invention is directed to a filter circuit. According to a first aspect of the present invention, the filter circuit has (n+1) filter coefficients $C_i$, each of which is a base R number and constituted of coefficient components $C_i^j$ ranging from $C_i^0$ for the least significant bit to $C_i^m$ (i, j, n, m: integer, $0 \leq i \leq n$, $0 \leq j \leq m$). The filter circuit of the first aspect has a structure of cascade connection of zeroth to m-th bit planes with multipliers having a multiplier of 1/R interposed, wherein a j-th bit plane has zeroth to n-th multipliers for multiplying input data to be processed in the filter circuit by the coefficient components $C_0^j$ to $C_n^j$, respectively; and n delay elements and n adders for performing accumulation of outputs of the n-th to zeroth multipliers while sequentially delaying the same in this order. In the filter circuit of the firs aspect, an output of the last one of the adders in the j-th bit plane is obtained as an output of the j-th bit plane, and an output of a (s−1) bit plane (s: integer, $1 \leq s \leq m$) is multiplied by a predetermined coefficient and is subject to the accumulation together with an output from a t-th multiplier (t: integer, $0 \leq t \leq (n-1)$) in an s-th bit plane.

According to a second aspect of the present invention, the filter circuit has (n+1) filter coefficients $C_i$, each of which is a base R number and constituted of coefficient components $C_i^j$ ranging from $C_i^0$ for the least significant bit to $C_i^m$ (i, j, n, m: integer, $0 \leq i \leq n$, $0 \leq j \leq m$). The filter circuit of the second aspect has a structure of cascade connection of zeroth to m-th bit planes with multipliers having a multiplier of 1/R interposed, wherein a j-th bit plane has zeroth to n-th multipliers for multiplying input data to be inputted thereto by the efficient components $C_0^j$ to $C_n^j$, respectively; and n adders for performing accumulation of outputs of the zeroth to n-th multipliers. In the filter circuit of the second aspect, the input data are inputted to the zeroth multiplier in the j-th bit plane through Nj delay elements (N: integer, $0 \leq N$), the input data are inputted to an h-th multiplier (h: integer, $1 \leq h \leq n$) in the j-th bit plane through ((M+1)h+Nj) delay elements (M: integer, $0 \leq M$), and an output of a (h−1)-th multiplier is delayed by M delay elements and added to an output of the h-th multiplier to achieve the accumulation.

According to a third aspect of the present invention, the filter circuit obtains the sum from i=0 to n $\Sigma\ C_i^j X_i 2^{j+k}$ (i, j, k, n, m: integer, $0 \leq i \leq n$, $0 \leq j \leq m$) that is a partial product $P_j$ from coefficient components $C_i^j$ each of "0" or "1" which constitute a binary filter coefficient $C_i$ from the least significant bit and delayed input data $X_i$ including input data $X_0$ and sequentially-delayed ones of the input data $X_0$, and further calculates the sum from i=0 to n $\Sigma\ C_i X_i$ that is the sum from j=0 to m of the partial product $P_j$ to be outputted. The filter circuit of the third aspect comprises: a common-term operation unit for obtaining an intermediate variable that is the sum from q=0 to n of the delayed input data $X_q$ (q: integer, at least two numbers not less than 0 and not more than n) when a plurality of the coefficient components $C_q^i$ are "1" in the partial product $P_j$; a j-th bit plane for calculating the partial product $P_j$ using the intermediate variable; and an s-th multiplier for multiplying an output of a (s−1)-th bit plane (s: integer, $1 \leq s \leq m$) by ½ to output the product to an s-th bit plane.

According to a fourth aspect of the present invention, the filter circuit of the third aspect has a plurality of the filter coefficients $C_i$, one of which is selected in response to a filter selection signal, for representing a plurality of filter characteristics. The filter circuit of the fourth aspect further comprises: a first selector for selectively outputting the delayed input data $X_i$ to the common-term operation unit in response to the filter selection signal, to obtain the intermediate variable in accordance with one of the plurality of filter characteristics; and a second selector for selectively outputting an output of the common-term operation unit and the delayed input data $X_i$ to the j-th bit plane, to obtain the partial product $P_j$ in accordance with one of the plurality of filter characteristics.

In the filter circuit of the first aspect, an output from the (s−1)-th bit plane is not added to an output from the n-th multiplier in the s-th bit plane but is to be accumulated together with an output from the t-th multiplier.

Therefore, the number of delay elements provided between the respective outputs of the bit planes and the output of the filter circuit decreases by the number ranging from 1 to n, and circuit scale of the filter circuit is reduced.

In the filter circuit of the second aspect, the input data to be processed in the filter circuit are inputted to the h-th multiplier through h delay elements. That allows the data for the h-th multiplier to be delayed by one relative to the data for the (h−1)-th multiplier.

The filter circuit of the second aspect needs only n delay elements to accumulate the outputs from (n+1) multipliers while sequentially delaying them, thus reducing the number of the delay elements as compared with the filter circuit of the first aspect which needs mn delay elements, and can achieve further reduction in circuit scale.

The filter circuit of the third aspect obtains the intermediate variable in advance, which is used in common to calculate the partial products $P_j$ to avoid duplication of additions in the multiply-add operation in each bit plane, and accordingly allows reduction in the number of adders included in each bit plane.

The filter circuit of the fourth aspect allows reduction in the number of adders included in each bit plane, like that of the third aspect, since the input data to be processed in the digital-signal processing circuit are inputted to the zeroth to m-th bit planes through the common-term operation unit.

Moreover, with the first selector provided between the delay elements for sequentially delaying the input data and the common-term operation unit, the data to be inputted to the common-term operation unit is selected in accordance with one of a plurality of filter characteristics of the filter circuit that the filter selection signal indicates.

Further, since the output of the common-term operation unit and the sequentially-delayed input data are once inputted to the second selector, the data to be inputted to a bit plane is selected in accordance with one of a plurality of characteristics of the filter circuit that the filter selection signal indicates.

In short, with the first and second selectors, it is possible for a common-term operation unit to handle a plurality of filter characteristics of the filter circuit. That obviously reduces the circuit scale as compared with providing a common-term operation unit for each of a plurality of filter circuits.

An object of the present invention is to reduce the number of delay elements and adders so as to achieve a filter circuit downsized in circuit scale.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 illustrates a connection of FIGS. 4 to 6;

FIG. 14 is a block diagram showing another configuration of a digital-signal processing circuit in accordance with the sixth preferred embodiment of the present invention;

DESCRIPTION OF THE PREFERRED EMBODIMENTS

The First Preferred Embodiment

Figure 1:
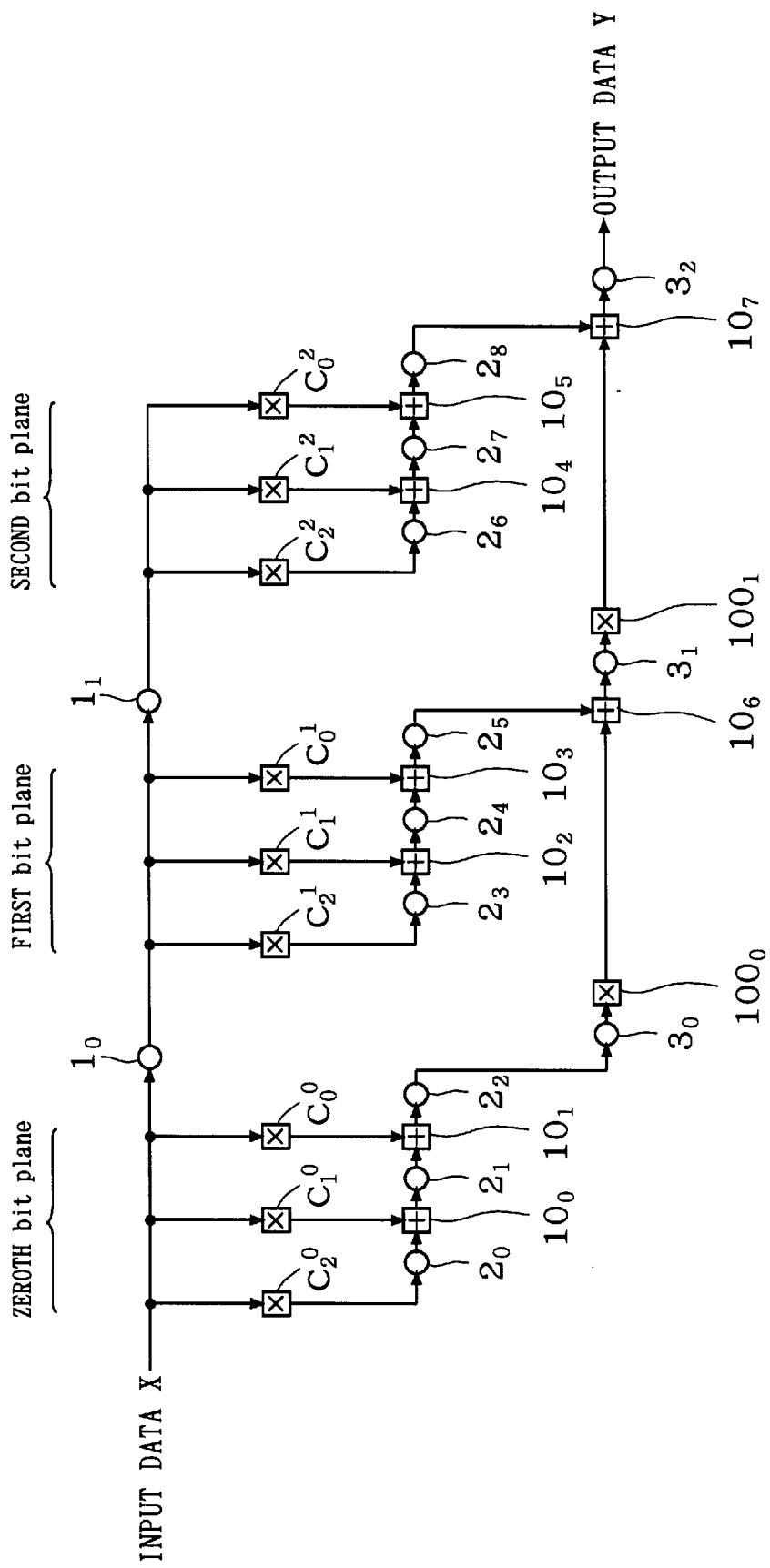
FIG. 1 is a block diagram showing a configuration of a filter circuit in accordance with a first preferred embodiment of the present invention.

A configuration of a filter circuit of the first preferred embodiment is shown in the block diagram of FIG. 1, where m=2 and n=2. Now, an operation of the filter circuit of FIG. 1 will be discussed below. In the zeroth bit plane, the input data X to be processed in the filter circuit are inputted to the multipliers $C_2^0$ to $C_0^0$ and multiplied by the respective multipliers to obtain partial products. The adder $10_0$ receives the partial product by the multiplier $C_2^0$ through the delay element $2_0$ and the partial product by the multiplier $C_1^0$, and outputs the addition result to the adder $10_1$ through the delay element $2_1$. Receiving the partial product by the multiplier $C_0^0$ on the other hand, the adder $10_1$ outputs the addition result as an output of the zeroth bit plane.

The output from the adder $10_1$, i.e., the output of the zeroth bit plane is delayed by the delay elements $2_2$ and $3_0$ not included in any bit plane and inputted to the multiplier $100_0$ also not included in any bit plane. The multiplier $100_0$, which has a multiplier ½, multiplies the data inputted thereto by ½, that is, shifts the data right one bit position and truncates the LSB, and outputs the multiplication result.

On the other hand, the input data X, being delayed by the delay element $1_0$ not included in any bit plane, are inputted to the multipliers $C_2^1$ to $C_0^1$ in the first bit plane and multiplied by the respective multipliers to obtain partial products. The adder $10_2$ receives the partial product by the multiplier $C_2^1$ through the delay element $2_3$ and the partial product by the multiplier $C_1^1$. The adder $10_3$ receives an output from the adder $10_2$ through the delay element $2_4$ and the partial product by the multiplier $C_0^1$, and outputs the addition result as an output of the first bit plane.

The adder $10_6$ receives the output from the adder $10_3$, i.e., the output of the first bit plane through the delay element $2_5$ not included in any bit plane and an output from the multiplier $100_0$, and outputs the addition result.

Similar operation is performed in the second bit plane, and then the adder $10_7$ outputs its addition result as the output data Y of the filter circuit.

Figure 17:
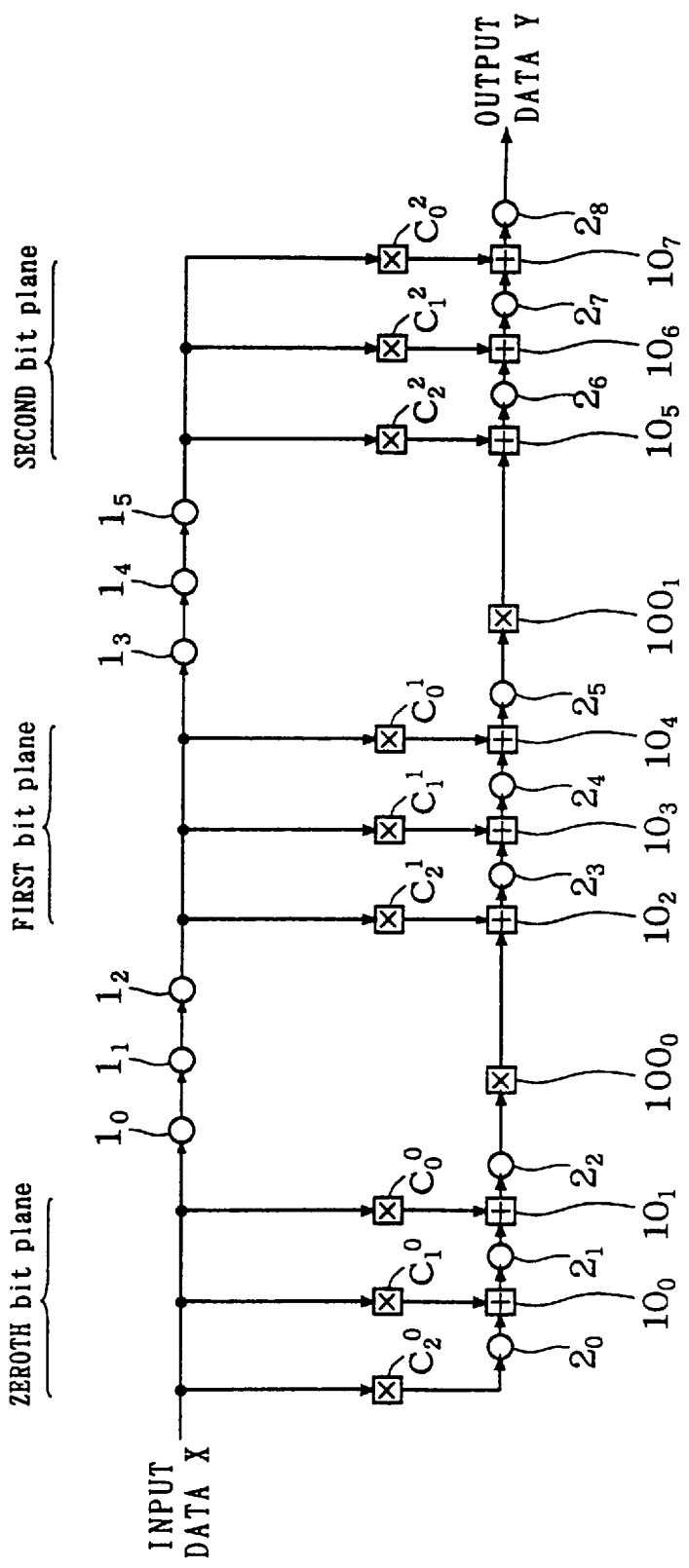
FIG. 17 is a block diagram showing a bit plane structure of a filter circuit in the background art.

Thus, the filter circuit of the first preferred embodiment has a bit plane structure equivalent to that of the background-art filter circuit of FIG. 17 in that the delay elements $2_0$, $2_1$, $2_3$, $2_4$, $2_6$ and $2_7$ are provided between the multiplier $C_{i+1}^j$ and the adders $10_0$ to $10_5$ which perform addition of the partial products by the multipliers $C_{i+1j}$ and $C_i^j$, to sequentially delay the input data X in accordance with the difference of filter coefficient when i is not more than (n−1).

Now, the difference between the bit plane structure of the filter circuit of the first preferred embodiment and that of the background-art filter circuit will be discussed. An output of the s-th bit plane ($0 \leq s \leq (m-1)$) is added to an output of the (s+1)-th bit plane in the filter circuit of the first preferred embodiment, while the output of the s-th bit plane is added to a partial product by the multiplier (coefficient component) $C_n^{s+1}$ in the (s+1)-th bit plane in the background art. As a result, the output of the s-th bit plane is not delayed by any of the delay elements for sequentially delaying the products obtained by multiplying the input data X by the coefficient components $C_n^{s+1}$ to $C_0^{s+1}$. For example, the output of the first bit plane is not delayed by any of the delay elements $2_6$ to $2_8$ which sequentially delay the products obtained by multiplying the input data X by the coefficient components $C_2^2$ to $C_0^2$ in the second bit plane.

In the background-art bit plane structure, three (n+1) delay elements $1_0$ to $1_2$ are needed between the zeroth bit plane and the first bit plane to delay the input data X correspondingly to the delay elements $2_3$ to $2_5$ of the first bit plane which delay the output from the adder $10_1$, i.e., the output of the zeroth bit plane. In contrast, since, for example, the output from the adder $10_1$, i.e., the output of the zeroth bit plane is not delayed by any of the delay elements $2_3$ to $2_5$ in the filter circuit of the first preferred embodiment, no delay element corresponding thereto is needed between the zeroth and first bit planes.

Specifically, the filter circuit of the first preferred embodiment needs eight ((m+1)(n+1)−1) adders like in the background art, and only fourteen ((m+1)(n+1)+(2 m+1)) delay elements. Thus, the number of the delay elements is reduced as compared with fifteen required in the background art under the same condition, m=2 and n=2.

Further, in the filter circuit of the first preferred embodiment, the input data X are delayed by (4+i) delay elements before and after being processed by the multiplier $C_i^j$ until outputted. In other words, it is found that the input data X, if processed by multipliers of the same kind of filter coefficients, should be delayed by the same number of delay elements until outputted from the filter circuit, and on the other hand, if processed by multipliers of different kinds of filter coefficients, the input data X processed by a multiplier with coefficient of larger i must be delayed by larger number of delay elements, like in the bit plane structure of the background art. The above discussion is based on the premise that the delay elements $1_0$ to $3_2$ should have the same performance.

Therefore, under the condition that satisfies Formula 1 as below, a filter circuit having the same characteristic features as the background-art bit plane structure can be achieved with a smaller number of delay elements. That results in reduction in circuit scale of the filter circuit.

$$\{(m+1)(n+1) + m(n+1)\} - \{(m+1)(n+1) + (2m+1)\} > 0 \quad (1)$$

$$\therefore n > \frac{m+1}{m}$$

Furthermore, the delay elements $1_0$, $1_1$, $2_2$, $2_5$, $2_8$, $3_0$, $3_1$ and $3_2$ are optionally provided to achieve a desired delay time depending on the performance of the delay elements, and may be omitted. Considering that, substantially, only six ((m+1)n) delay elements are needed.

While the configuration of FIG. 1 where the output of the s-th bit plane is added to the output of the (s+1)-th bit plane has been discussed above, there may be a configuration of FIG. 2 where the output of the s-th bit plane is added to the partial product by the multiplier $C_1^{s+1}$ ($1 \leq t \leq (n-1)$) in the (s+1)-th bit plane, to reduce the number of delay elements that should be provided to delay the input data X between the bit planes by (n-t), for downsized circuit scale.

Figure 2:
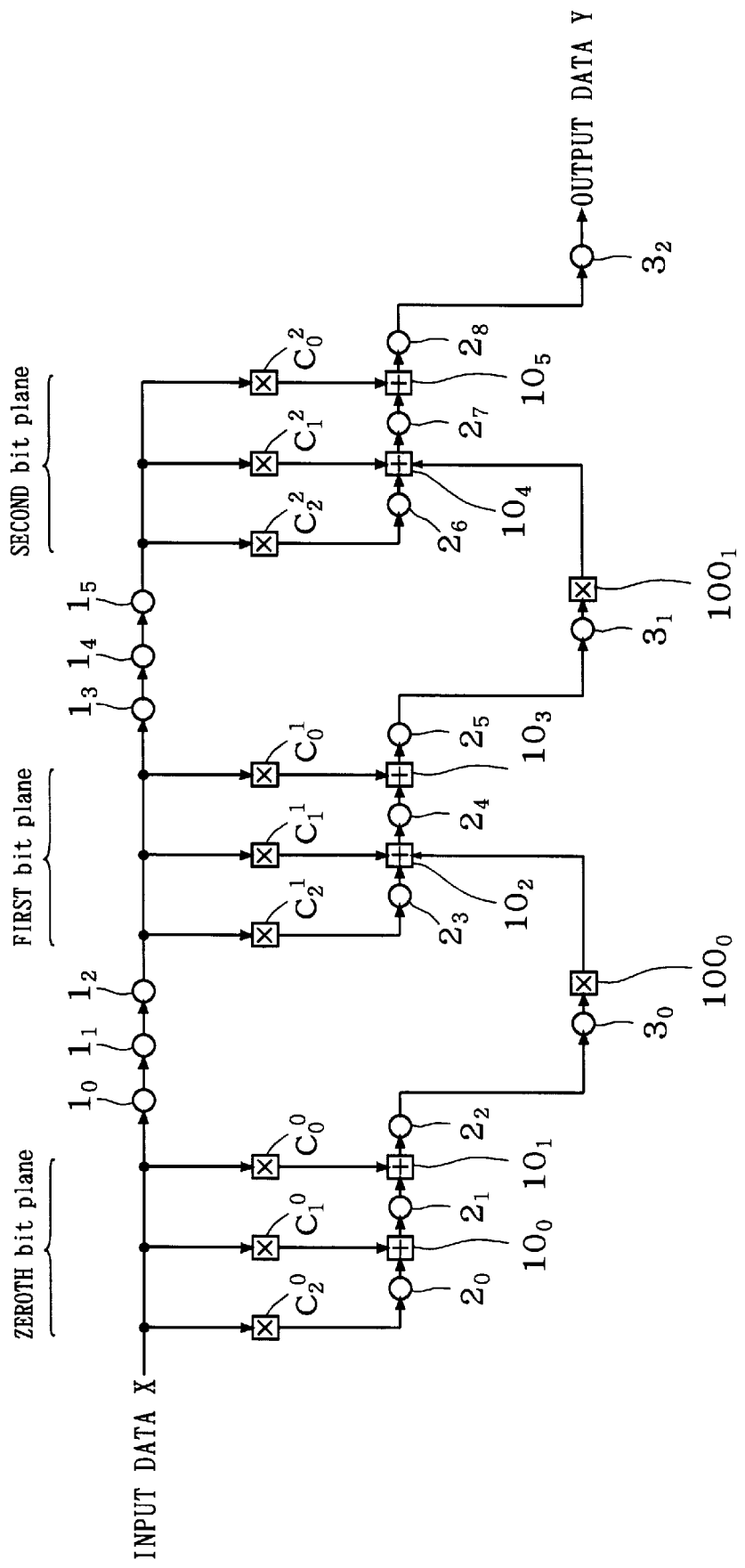
FIG. 2 is a block diagram showing another configuration of a filter circuit in accordance with the first preferred embodiment of the present invention.

As compared with the background-art bit plane structure, three delay elements are interposed between the bit planes also in the filter circuit of FIG. 2 to delay the input data X, but the delay elements $1_2$ and $1_5$ are provided correspondingly to the delay elements $3_0$ and $3_1$ in FIG. 2 and intrinsically different from those of the background-art bit plane structure.

The Second Preferred Embodiment

Figure 4:
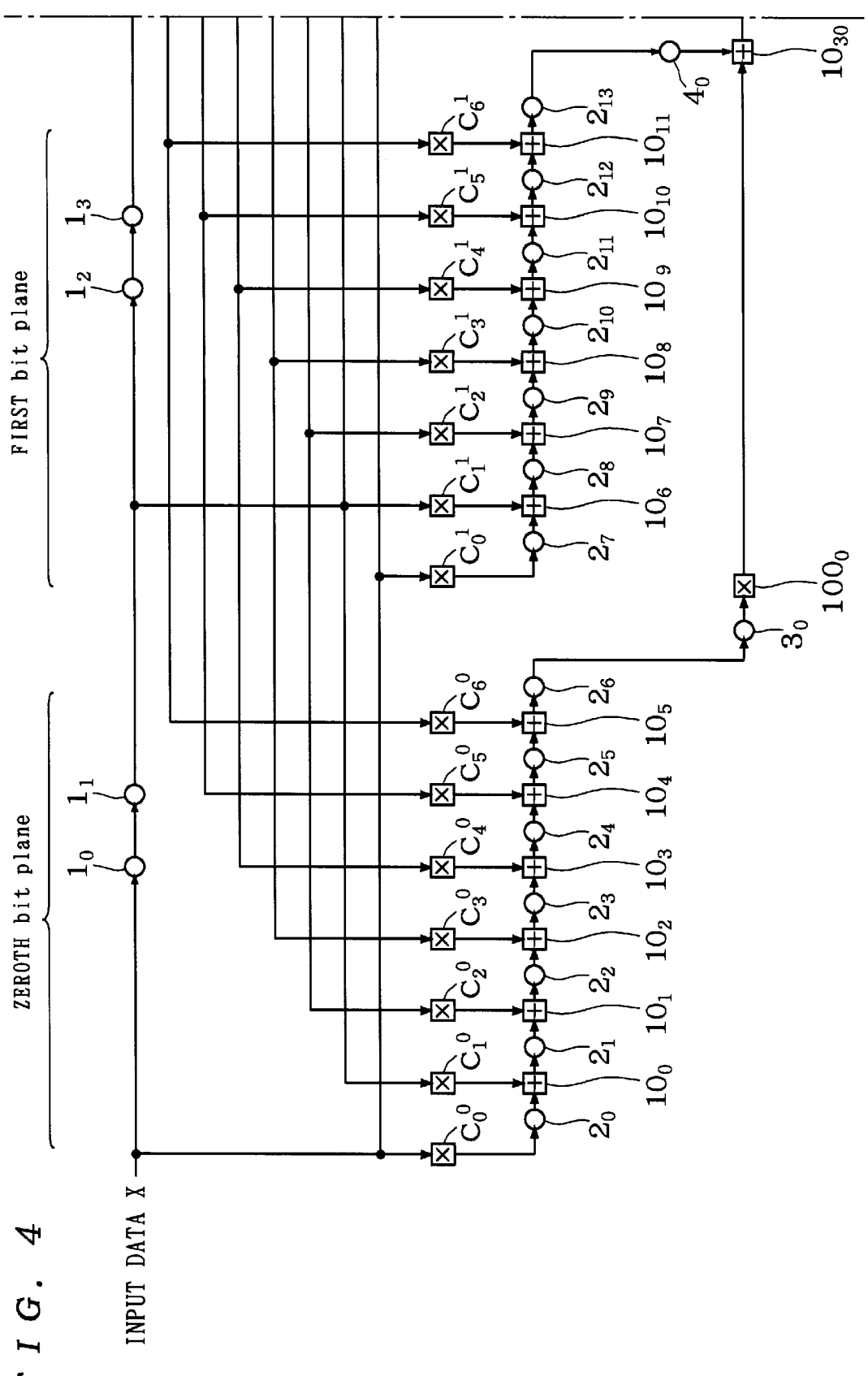
FIGS. 4 to 6 are block diagrams showing a configuration of a filter circuit in accordance with a second preferred embodiment of the present invention.
Figure 5:
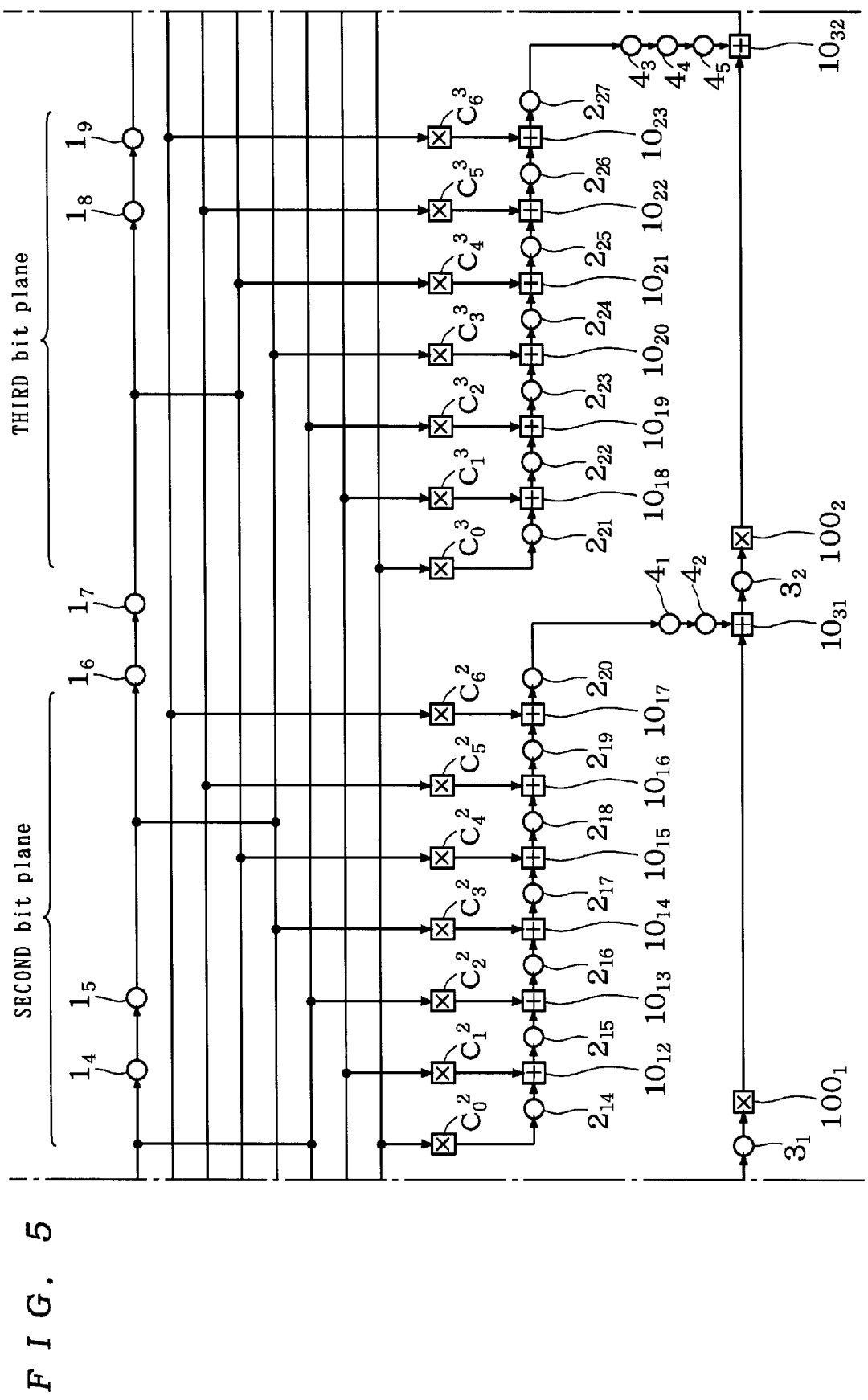
Figure 6:
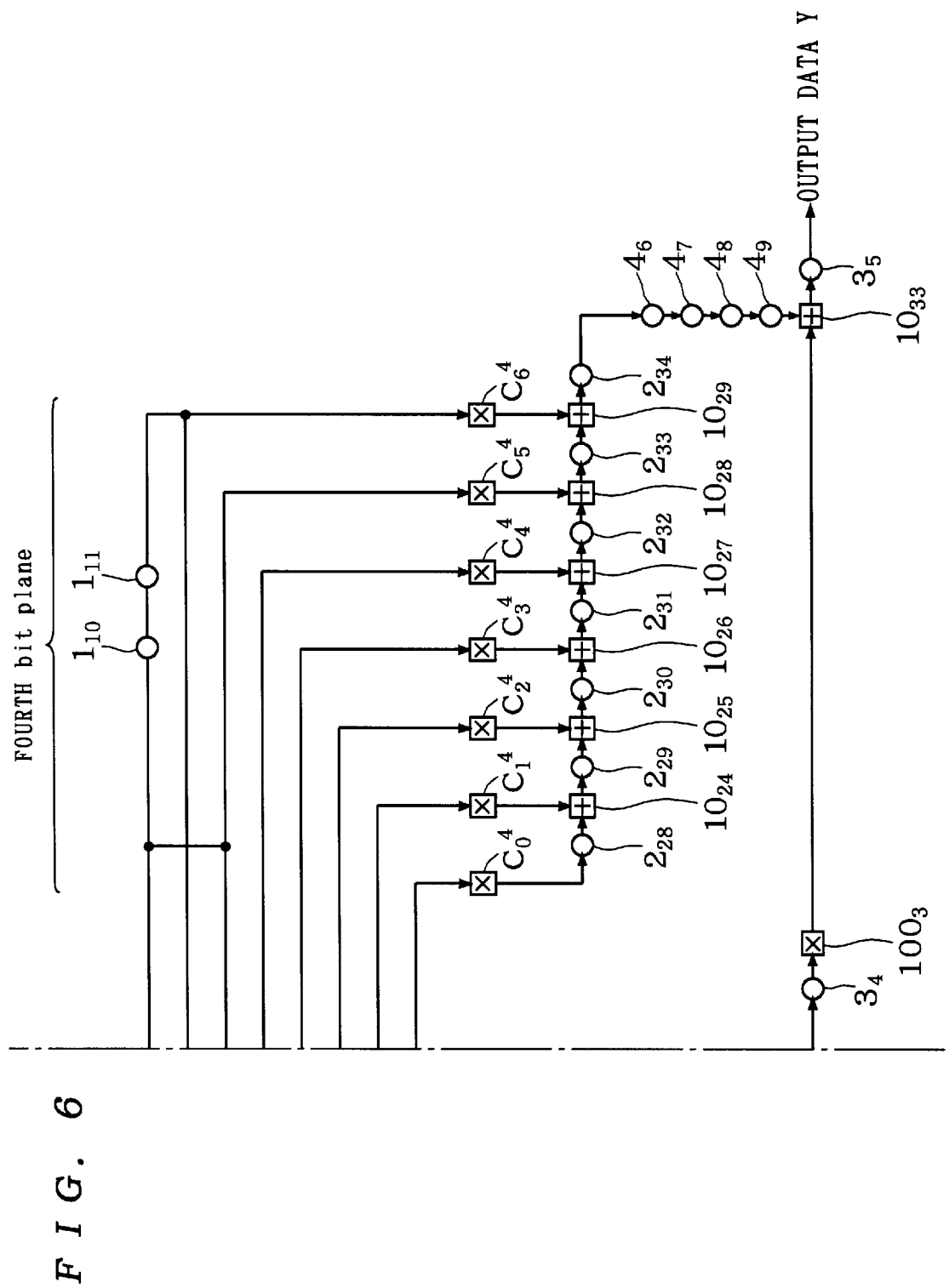

FIG. 3 illustrates a connection of the following block diagrams of FIGS. 4 to 6. A configuration of a filter circuit of the second preferred embodiment is shown in the block diagrams of FIGS. 4 to 6 connected with virtual dashed-and-dotted lines as shown in FIG. 3, where m=4 and =6. An operation of the filter circuit will be discussed below. The input data X are inputted to multipliers $C_0^j$ in each bit plane and multiplied by the respective multipliers to obtain partial products. Further, multipliers $C_1^j$ in each bit plane receive the input data X delayed by the delay elements $1_0$ and $1_1$ and multiply the input data X by the respective multipliers to obtain partial products. Similarly, multipliers $C_2^j$ in each bit plane receive the input data X delayed by the delay elements $1_0$ to $1_3$, multipliers $C_3^j$ in each bit plane receive the input data X delayed by the delay elements $1_0$ to $1_5$, multipliers $C_4^j$ in each bit plane receive the input data X delayed by the delay elements $1_0$ to $1_7$, multipliers $C_5^j$ in each bit plane receive the input data X delayed by the delay elements $1_0$ to $1_9$ and multipliers $C_6^j$ in each bit plane receive the input data X delayed by the delay elements $1_0$ to $1_{11}$, and then the multipliers $C_2^j$ to $C_6^j$ multiply the input data X by the respective multipliers to obtain partial products.

The partial products by the respective multipliers are accumulated by bit plane with the adders $10_0$ to $10_{29}$. Then, the adders $10_5$, $10_{11}$, $10_{17}$, $10_{23}$ and $10_{29}$ output their addition results as outputs of the respective bit planes. The output from the adder $10_5$, i.e., the output of the zeroth bit plane is delayed by the delay elements $2_6$ and $3_0$ not included in any bit plane and the multiplier $100_0$ having a multiplier of ½ also not included in any bit plane, and inputted to an adder $10_{30}$. Further, the output from the adder $10_{11}$, i.e., the output of the first bit plane is delayed by the delay elements $2_{13}$ and $4_0$ not included in any bit plane, and inputted to an adder $10_{30}$. An output from the adder $10_{30}$ is delayed by the delay element $3_1$ not included in any bit plane and the multiplier $100_1$ having a multiplier of ½ also not included in any bit plane, and inputted to an adder $10_{31}$. The output from the adder $10_{17}$, i.e., the output of the second bit plane is delayed by the delay elements $2_{20}$, $4_1$ and $4_2$ not included in any bit plane, and inputted to an adder $10_{31}$. An output from the adder $10_{31}$ is delayed by a delay element $3_2$ not included in any bit plane and a multiplier $100_2$ having a multiplier of ½ also not included in any bit plane, and inputted to an adder $10_{32}$. The output from the adder $10_{23}$, i.e., the output of the third bit plane is delayed by delay elements $2_{27}$ and $4_3$ to $4_5$ not included in any bit plane, and inputted to an adder $10_{32}$. An output from the adder $10_{32}$ is delayed by a delay element $3_4$ not included in any bit plane and a multiplier $100_3$ having a multiplier of ½ also not included in any bit plane, and inputted to an adder $10_{33}$. The output from the adder $10_{29}$, i.e., the output of the fourth bit plane is delayed by delay elements $2_{34}$ and $4_6$ to $4_9$ not included in any bit plane, and inputted to an adder $10_{33}$. The adder $10_{33}$ outputs its addition result as the output data Y of the filter circuit.

Thus, the filter circuit of the second preferred embodiment is equivalent to that of the first preferred embodiment in that the output of the s-th bit plane is added to the output of the (s+1)-th bit plane, but different therefrom in the order of accumulation of the partial products: the partial products by multiplier $C_i^j$ in each bit plane are sequentially accumulated in ascending order of i in the second preferred embodiment, while those are sequentially accumulated in descending order of i in the first preferred embodiment. Besides, the following differences are found between the first and second preferred embodiments.

First, when i is not more than (n−1), the delay elements $1_0$, $1_2$, $1_4$, $1_6$, $1_8$ and $1_{10}$ are provided to sequentially delay the input data X in accordance with the difference of filter coefficient before inputting to the multipliers in the filter circuit of the second preferred embodiment, while the delay elements $2_0$, $2_1$, $2_3$, $2_4$, $2_6$ and are provided between the multiplier $C_{i+1}^j$ and the adders $10_0$ to $10_5$ which perform addition of the partial products by the multipliers $C_{i+1}^j$ and $C_i^j$ to sequentially delay the input data X in accordance with the difference of filter coefficient in the filter circuit of the first preferred embodiment.

In particular, when the delay elements $2_{7j}$ to $2_{7j+5}$ are interposed between the multiplier $C_0^j$ and the adder $10_{5+6j}$ as shown in FIGS. 4 to 6, n pairs of two delay elements, that is, 2n delay elements ($1_0$, $1_1$), ($1_2$, $1_3$), ($1_4$, $1_5$), ($1_6$, $1_7$), ($1_8$, $1_9$) and ($1_{10}$, $1_{11}$) are provided to sequentially delay the input data X in accordance with the difference of filter coefficient, unlike in the filter circuit of the first preferred embodiment.

Second, while only one delay element (e.g., $2_5$) is interposed between the last adder (e.g., $10_3$) in a bit plane which outputs the output data of the bit line and the adder (e.g., $10_6$) which adds the output data of the bit plane to the output data of the immediately preceding bit plane in the filter circuit of the first preferred embodiment, j delay elements are additionally provided in the j-th bit plane, i.e., $4_0$ for the first bit plane, ($4_1$, $4_2$) for the second bit plane, ($4_3$, $4_4$, $4_5$) for the third bit plane, ($4_6$, $4_7$, $4_8$, $4_9$) for in the fourth bit plane in the filter circuit of the second preferred embodiment.

Thus, the filter circuit of the second preferred embodiment needs thirty-four ((m+1)(n+1)−1) adders like in the background art, and only sixty-two ((m+1)(n+1)+2 n+½ m(m+1)+(m+1)) delay elements. Thus, the number of the delay elements is reduced as compared with sixty-three required in the background art under the same condition, m=4 and n=6.

Further, in the filter circuit of the second preferred embodiment, the input data X are delayed by (12+i) delay elements before and after being processed by the multiplier $C_i^j$ until outputted. In other words, it is found that the input data X, if processed by multipliers of the same kind of filter coefficients, should be delayed by the same number of delay elements until outputted from the filter circuit, and on the other hand, if processed by multipliers of different kinds of filter coefficients, the input data X processed by a multiplier with coefficient of larger i must be delayed by larger number of delay elements, like in the bit plane structure of the background art.

Therefore, under the condition that satisfies Formula 2 as below, a filter circuit having the same characteristic features as the background-art bit plane structure can be achieved with a smaller number of delay elements. That results in reduction in circuit scale of the filter circuit.

$$\{(m+1)(n+1) + m(n+1)\} - \qquad (2)$$
$$\left\{(m+1)(n+1) + 2n + \frac{1}{2}m(m+1) + (m+1)\right\} > 0$$
$$\therefore n > \frac{1}{2(m-2)}(m^2 + m + 2)$$

While the configuration where the output of the s-th bit plane is added to the output of the (s+1)-th bit plane has been discussed above, there may be a configuration where the output of the s-th bit plane is added to the partial product by the multiplier $C_t^{s+1}$ ($1 \le t \le (n-1)$) in the (s+1)-th bit plane, to reduce the number of delay elements that should be provided to delay the input data X, for downsized circuit scale.

Furthermore, the delay elements $1_1$, $1_3$, $1_5$, $1_7$, $1_9$, $1_{11}$, $2_0$ to $2_{34}$, $3_0$ to $3_5$ and $4_0$ to $4_9$ are optionally provided to achieve a desired delay time depending on the performance of the delay elements, and may be omitted. Considering that, substantially, only six (n) delay elements are needed.

The Third Preferred Embodiment

Figure 7:
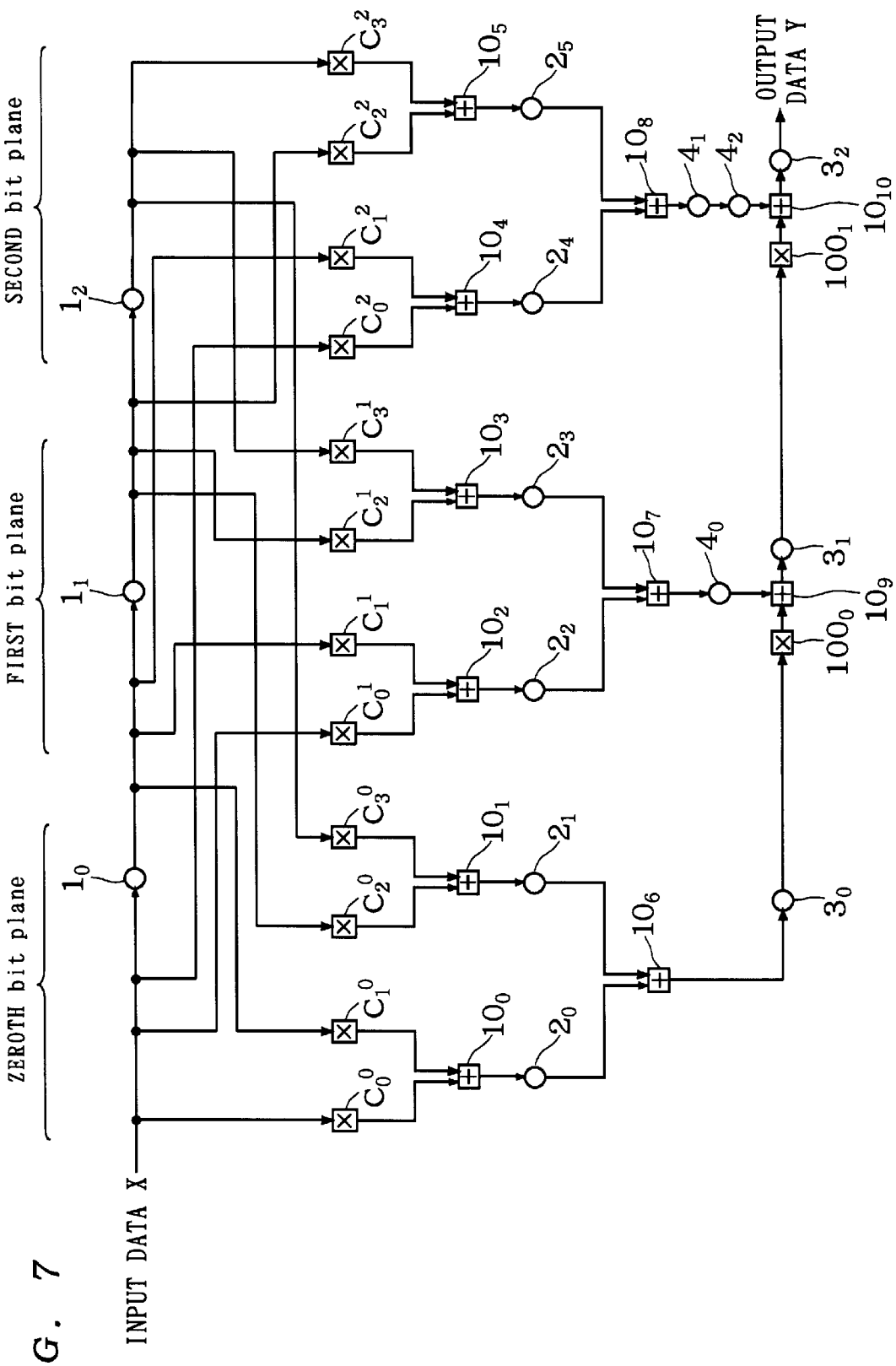
FIG. 7 is a block diagram showing a configuration of a filter circuit in accordance with a third preferred embodiment of the present invention.

A configuration of a filter circuit of the third preferred embodiment is shown in the block diagram of FIG. 7, where m=2 and n=3. An operation of the filter circuit will be discussed below. The input data X are inputted to multipliers $C_0^j$ in each bit plane and multiplied by the respective multipliers to obtain partial products. Similarly, multipliers $C_1^j$ in each bit plane receive the input data X delayed by the delay element $1_0$, multipliers $C_2^j$ in each bit plane receive the input data X delayed by the delay elements $1_0$ and $1_1$ and multipliers $C_3^j$ in each bit plane receive the input data X delayed by the delay elements $1_0$ to $1_2$, and then the multipliers $C_1^j$ to $C_3^j$ multiply the input data X by the respective multipliers to obtain partial products.

In each bit plane, a group of tree-structured adders are employed to perform addition of the partial products by the respective multipliers. For example, in zeroth bit plane, the adder $10_0$ adds the partial product by the multiplier $C_0^0$ to the partial product by the multiplier $C_1^0$ and the adder $10_1$ adds the partial product by the multiplier $C_2^0$ to the partial product by the multiplier $C_3^0$. Subsequently, the adder $10_6$ adds an output from the adder $10_0$ through the delay element $2_0$ to an output from the adder $10_1$ through the delay element $2_1$, and outputs the addition result as an output of the zeroth bit plane. Similar operation is performed in the first and second bit planes, and specifically the adder $10_7$ outputs its addition result as an output of the first bit plane and the adder $10_8$ outputs its addition result as an output of the second bit plane.

The output from the adder $10_6$, i.e., the output of the zeroth bit plane is delayed by the delay element. $3_0$ not included in any bit plane and the multiplier $100_0$ having a multiplier of ½ also not included in any bit plane, and inputted to the adder $10_9$. The output from the adder $10_7$, i.e., the output of the first bit plane is delayed by the delay element $4_0$ not included in any bit plane and inputted to the adder $10_9$. An output from the adder $10_9$ is delayed by the delay element $3_1$ not included in any bit plane and the multiplier $100_1$ having a multiplier of ½ also not included in any bit plane, and inputted to the adder $10_{10}$. The output from the adder $10_8$, i.e., the output of the second bit plane is delayed by the delay elements $4_1$ and $4_2$ not included in any bit plane and inputted to the adder $10_{10}$. The adder $10_{10}$ outputs the addition result as the output data Y of the filter circuit.

Thus, the filter circuit of the third preferred embodiment is equivalent to that of the second preferred embodiment in that the delay elements $1_0$, $1_1$ and $1_2$ are provided to sequentially delay the input data X in accordance with the difference of filter coefficient before inputting to the multipliers, that is, the input data X are completely delayed in accordance with the difference of filter coefficient before being inputted to the multipliers.

As discussed above, however, the filter circuit of the third preferred embodiment is different from that of the second preferred embodiment in that the group of tree-structured adders are employed to perform addition of the partial products by the respective multipliers, that is, a delay element which is optionally provided to achieve a desired delay time can perform a delay function on more than one multiplier by using the group of tree-structured adders. That allows further reduction in the number of delay elements to be provided in the filter circuit.

Thus, the filter circuit of the third preferred embodiment needs eleven ((m+1)(n+1)−1) adders like in the background art, and only fifteen ((m+1)(n−1)+n+½ m(m+1)+(m+1)) delay elements. Thus, the number of the delay elements is reduced as compared with twenty required in the background art under the same condition, m=2 and n=3.

Further, in the filter circuit of the third preferred embodiment, the input data X are delayed by (4+i) delay elements before and after being processed by the multiplier $C_i^j$ until outputted. In other words, it is found that the input data X, if processed by multipliers of the same kind of filter coefficients, should be delayed by the same number of delay elements until outputted from the filter circuit, and on the other hand, if processed by multipliers of different kinds of filter coefficients, the input data X processed by a multiplier with coefficient of larger i must be delayed by larger number of delay elements, like in the bit plane structure of the background art. The above discussion is based on the premise that the delay elements $1_0$ to $4_2$ should have the same performance.

Therefore, under the condition that satisfies Formula 3 as below, a filter circuit having the same characteristic features as the background-art bit plane structure can be achieved with a smaller number of delay elements. That results in reduction in circuit scale of the filter circuit.

$$\{(m+1)(n+1) + m(n+1)\} - \qquad (3)$$

-continued $$\left\{ (m+1)(n-1) + n + \frac{1}{2} m(m+1) + (m+1) \right\} > 0$$

$$\therefore n > \frac{1}{2(m-1)} (m^2 - 3m - 2) \quad 5$$

Furthermore, the delay elements $2_0$ to $2_5$, $3_0$ to $3_2$ and $4_0$ to $4_2$ are optionally provided to achieve a desired delay time in accordance with the performance of the delay elements, and may be omitted. Considering that, substantially, only three (n) delay elements are needed.

The Fourth Preferred Embodiment

Figures 8, 9, 10:
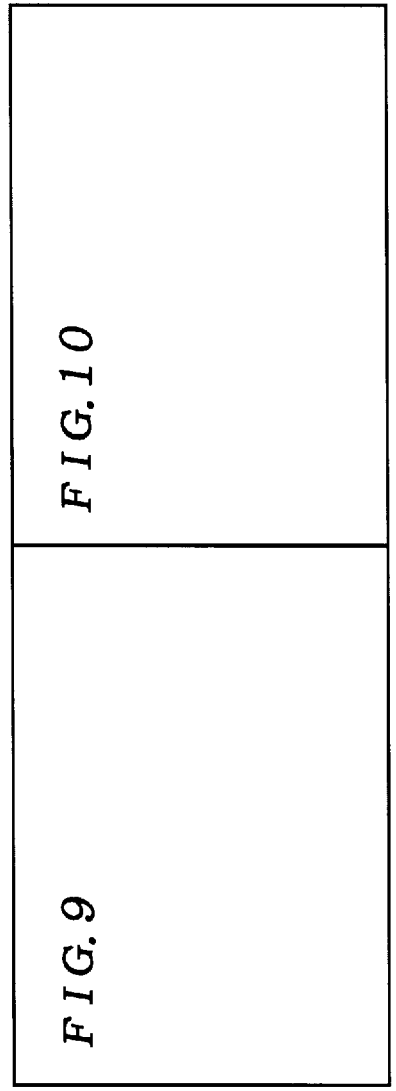
FIG. 8 illustrates a connection of FIGS. 9 and 10.
FIGS. 9 and 10 are block diagrams showing a configuration of a filter circuit in accordance with a fourth preferred embodiment of the present invention.
Figure 9:
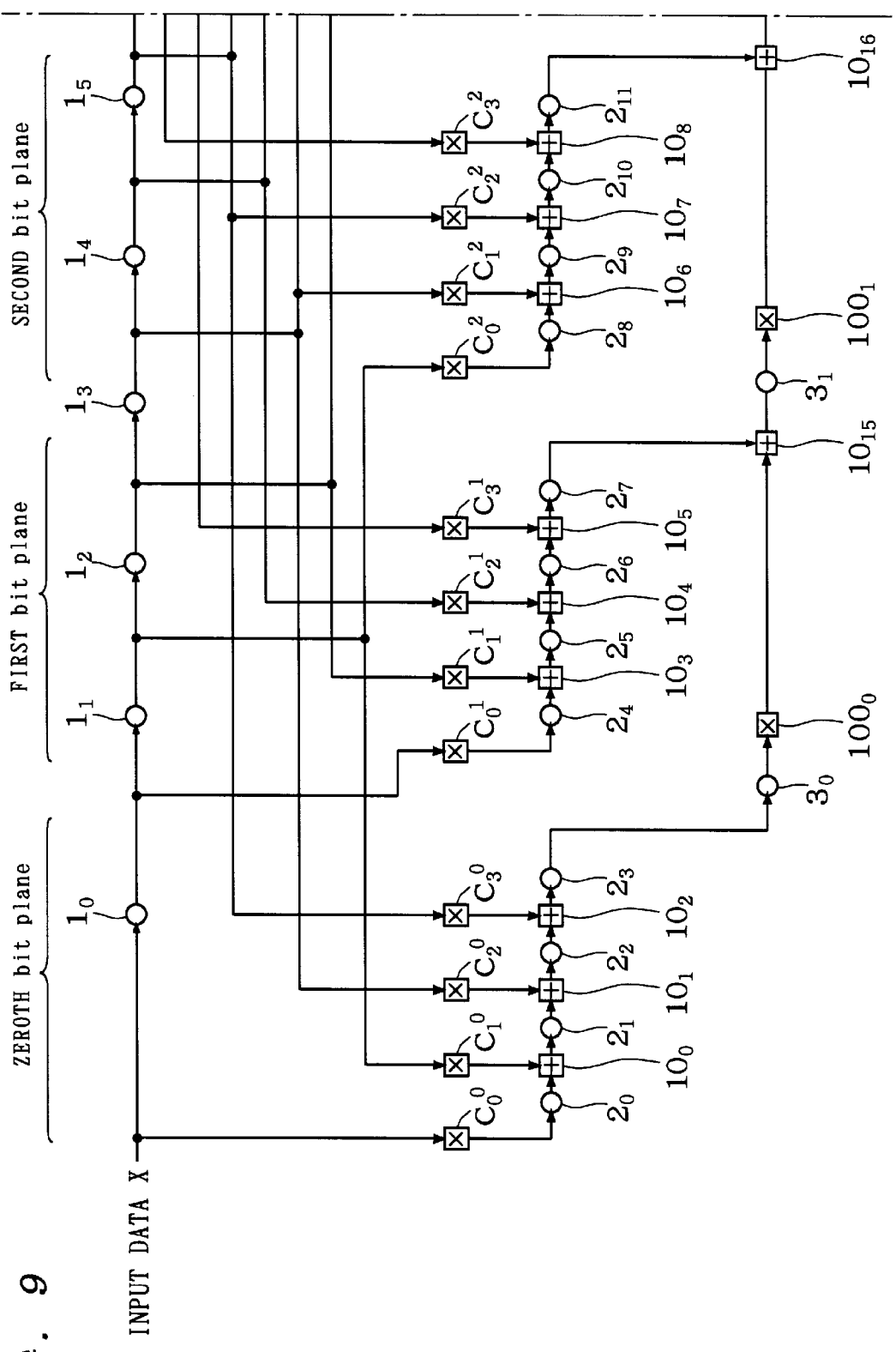
Figure 10:
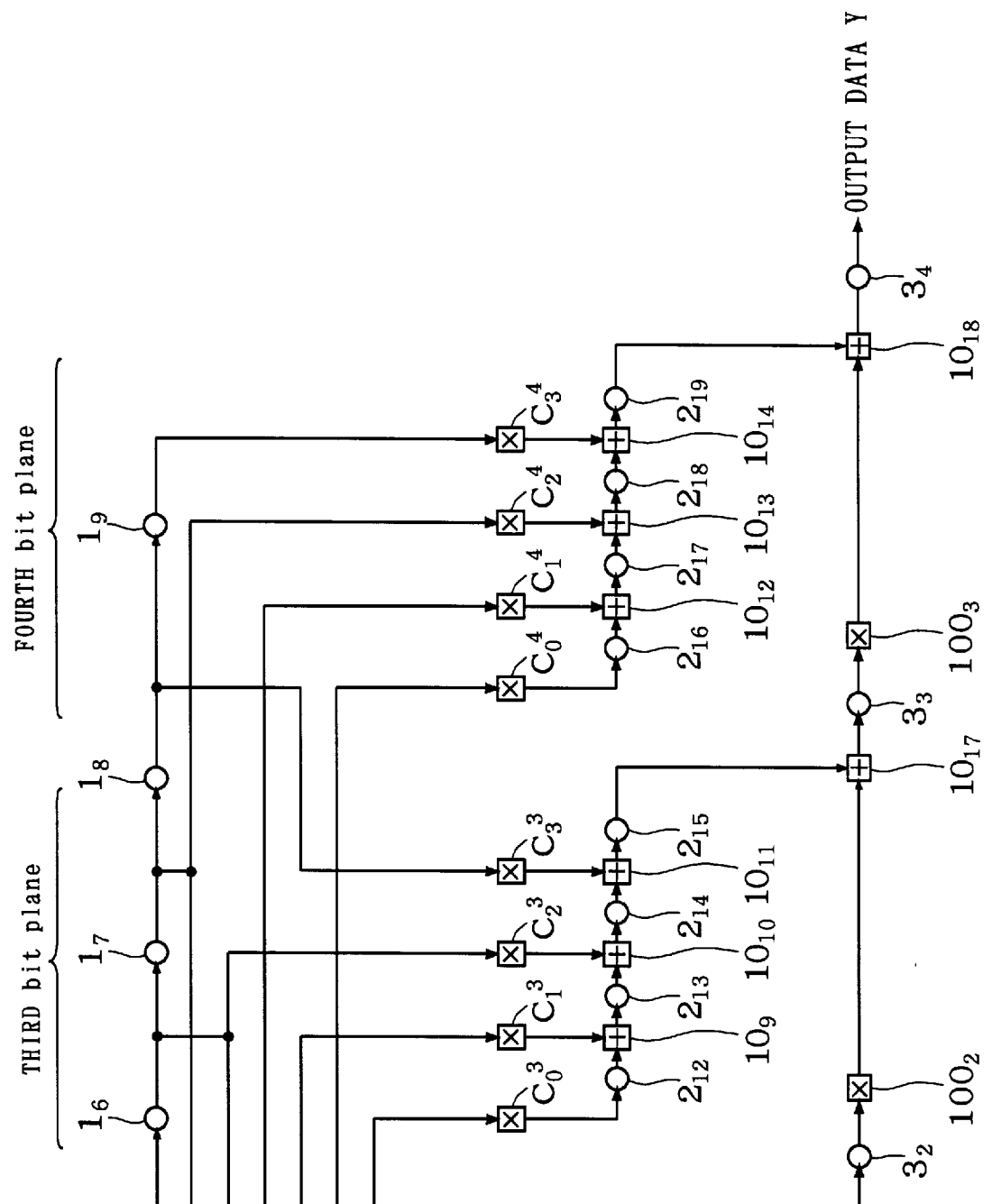

FIG. 8 illustrates a connection of the following block diagrams of FIGS. 9 and 10. A configuration of a filter circuit of the fourth preferred embodiment is shown in the block diagrams of FIGS. 9 and 10 connected with virtual dashed-and-dotted lines as shown in FIG. 8, where m=4 and n=3. An operation of the filter circuit will be discussed below. The input data X are inputted to the multiplier $C_0^0$ in the zeroth bit plane and multiplied by the multiplier $C_0^0$ to obtain the partial product. The multiplier $C_0^1$ in the first bit plane receives the input data X through the delay element $1_0$ and multiplies the input data X by the multiplier $C_0^1$ to obtain the partial product. Similarly, the multiplier $C_0^2$ in the second bit plane receives the input data X through the delay elements $1_0$ and $1_1$, the multiplier $C_0^3$ in the third bit plane receives the input data X through the delay elements $1_0$ to $1_2$ and the multiplier $C_0^4$ in the fourth bit plane receives the input data X through the delay elements $1_0$ to $1_3$, and then the multipliers $C_0^2$ to $C_0^4$ multiply the input data X by the respective multipliers to obtain partial products.

The multiplier $C_1^0$ in the zeroth bit plane receives the input data X delayed by two delay elements $1_0$ and $1_1$. In the first and later bit planes, the multipliers $C_1^j$ receive the input data X delayed by (2+j) delay elements $1_0$ to $1_{j+1}$. Similarly, if i is more than 1, the multipliers $C_i^0$ in the zeroth bit plane receive the input data X delayed by 2 i delay elements $1_0$ and $1_{2i-1}$, and in the first and later bit planes, the multipliers $C_i^j$ receive the input data X delayed by (2 i+j) delay elements $1_0$ to $1_{2i+j-1}$. Then the multipliers $C_i^j$ multiply the input data X by the respective multipliers to obtain partial products.

Through the following multiply-add operation as performed in the first preferred embodiment, the output data Y of the filter circuit are outputted from the adder $10_{18}$.

Thus, the filter circuit of the fourth preferred embodiment needs nineteen((m+1)(n+1)−1) adders like in the background art, and only thirty-five ((m+1)(n+1)+(m+2 n)+(m+1)) delay elements. Thus, the number of the delay elements is reduced as compared with thirty-six required in the background art under the same condition, m=4 and n=3.

Further, in the filter circuit of the fourth preferred embodiment, the input data X are delayed by (9+i) delay elements before and after being processed by the multiplier $C_i^j$ until outputted. In other words, it is found that the input data X, if processed by multipliers of the same kind of filter coefficients, should be delayed by the same number of delay elements until outputted from the filter circuit, and on the other hand, if processed by multipliers of different kinds of filter coefficients, the input data X processed by a multiplier with coefficient of larger i must be delayed by larger number of delay elements, like in the bit plane structure of the background art. The above discussion is based on the premise that the delay elements $1_0$ to $3_4$ should have the same performance.

Therefore, under the condition that satisfies Formula 4 as below, a filter circuit having the same characteristic features as the background-art bit plane structure can be achieved with a smaller number of delay elements. That results in reduction in circuit scale of the filter circuit.

$$\{(m+1)(n+1) + m(n+1)\} - \quad (4)$$

$$\{(m+1)(n+1) + (m+2n) + (m+1)\} > 0$$

$$\therefore n > \frac{m+1}{m-2}$$

Furthermore, the delay elements $2_3$, $2_7$, $2_{11}$, $2_{15}$ and $2_{19}$ are optionally provided to achieve a desired delay time in accordance with the performance of the delay elements, and may be omitted.

The filter circuit of the fourth preferred embodiment, which is based on the same idea as the first preferred embodiment, achieves a sequential delay of the input data X in accordance with the difference of filter coefficient by interposing the delay elements $2_{4j}$ to $2_{2+4j}$ between the multipliers $C_0^j$ and the adders $10_{2+3j}$ in each bit plane. Therefore, the delay elements $1_0$ to $1_9$ and $3_0$ to $3_4$ may be omitted. Considering that, substantially, only fifteen ((m+1) n) delay elements are needed.

While the configuration where the output of the s-th bit plane is added to the output of the (s+1)-th bit plane has been discussed above, there may be a configuration where the output of the s-th bit plane is added to the partial product by the multiplier $C_t^{s+1}$ ($1 \leq t \leq (n-1)$) in the (s+1)-th bit plane, to reduce the number of delay elements that should be provided to delay the input data X, for downsized circuit scale.

The Fifth Preferred Embodiment

First considered is a filtering operation as expressed in Formula 5:

$$Y = \frac{11}{128} X_0 + \frac{11}{64} X_1 + \frac{21}{64} X_2 + \quad (5)$$

$$\frac{5}{32} X_3 + \frac{27}{128} X_4 + \frac{3}{64} X_5$$

Formula 5 may be modified into Formula 6 as below:

$$Y \left( \frac{1}{16} + \frac{1}{64} + \frac{1}{128} \right) X_0 + \quad (6)$$

$$\left( \frac{1}{8} + \frac{1}{32} + \frac{1}{64} \right) X_1 + \left( \frac{1}{4} + \frac{1}{16} + \frac{1}{64} \right) X_2 +$$

$$\left( \frac{1}{8} + \frac{1}{32} \right) X_3 + \left( \frac{1}{8} + \frac{1}{16} + \frac{1}{64} + \frac{1}{128} \right) X_4 +$$

$$\left( \frac{1}{32} + \frac{1}{64} \right) X_5 = \frac{1}{4} X_2 + \frac{1}{8} (X_1 + X_3 + X_4) +$$

$$\frac{1}{16} (X_0 + X_2 + X_4) + \frac{1}{32} (X_1 + X_3 + X_5) +$$

$$\frac{1}{64} (X_0 + X_1 + X_2 + X_4 + X_5) + \frac{1}{128} (X_0 + X_4)$$

The terms $(X_1+X_3)$ and $(X_0+X_2+X_4)$ repeatedly appear in Formula 6. Replacing the terms (common terms) that repeatedly appear by intermediate variables, Formula 6 may be modified into Formula 7 as below, where $A=X_1+X_3$ and $B=X_0+X_2+X_4$:

$$Y = \frac{1}{4} X_2 + \frac{1}{8} (A + X_4) + \frac{1}{16} B + \quad (7)$$

-continued $$\frac{1}{32}(A+X_5)+\frac{1}{64}(B+X_1+X_5)+\frac{1}{128}(X_0+X_4)$$

To obtain Y, Formula 6 needs sixteen additions. On the other hand, if the intermediate variables are used, only thirteen additions are needed (three for the intermediate variables and ten for Formula 7). In short, replacing the common terms by the intermediate variables allows some of the calculation steps (specifically, addition steps) to be omitted.

Applying the idea of replacing the common terms by the intermediate variables for less addition steps to a general digital filter of fixed-coefficient, the fifth preferred embodiment achieves reduction in the number of adders.

A configuration of a filter circuit of the fifth preferred embodiment is shown in FIG. $1_1$. First, the input data X are delayed by the delay elements $1_0$ to $1_k$ (k: natural number), and inputted to a common-term operation unit and the zeroth to m-th partial-product addition units. The common-term operation unit consists of a plurality of adders, and performs addition of the common terms prior to the multiply-add operations in the zeroth to m-th partial-product addition units. Outputs of the common-term operation unit as the intermediate variable are inputted to the zeroth to m-th partial product addition units. Each partial-product addition unit performs the multiply-add operation of the input data X sequentially delayed by the delay elements $1_0$ to $1_k$ and the outputs of the common-term operation unit. Outputs from the partial-product addition units are accumulated through the multipliers having a multiplier of ½, respectively, to finally obtain the output data Y of the filter circuit.

Figure 11:
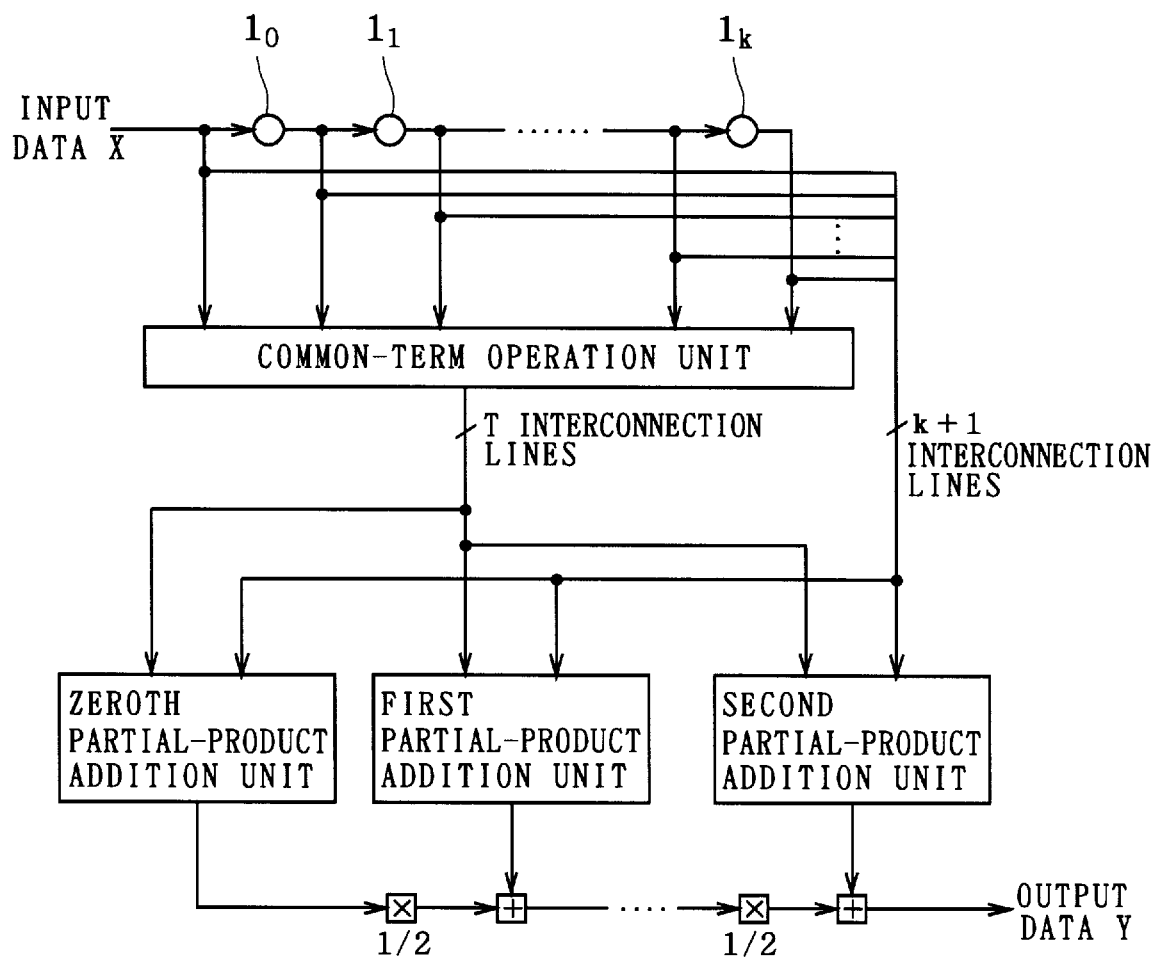
FIG. 11 is a block diagram showing a configuration of a filter circuit in accordance with a fifth preferred embodiment of the present invention.

FIG. 11 shows (k+1) interconnection lines for transferring the sequentially-delayed input data X to the partial-product addition units. This means that the filter circuit employs a maximum of (k+1) lines. Taking the transfer function of Formula 7 as an example, the term $X_3$ does not appear in Formula 7 after replacement by the intermediate variables, and therefore there is no need for transferring $X_3$ to the partial-product addition units, nor for providing interconnection line used therefore in the filter circuit.

As the same applies to the interconnection lines for transferring the outputs from the common-term operation unit to the partial-product addition units, some of the interconnection lines may not be needed depending on characteristics of the filter circuit.

Figure 12:
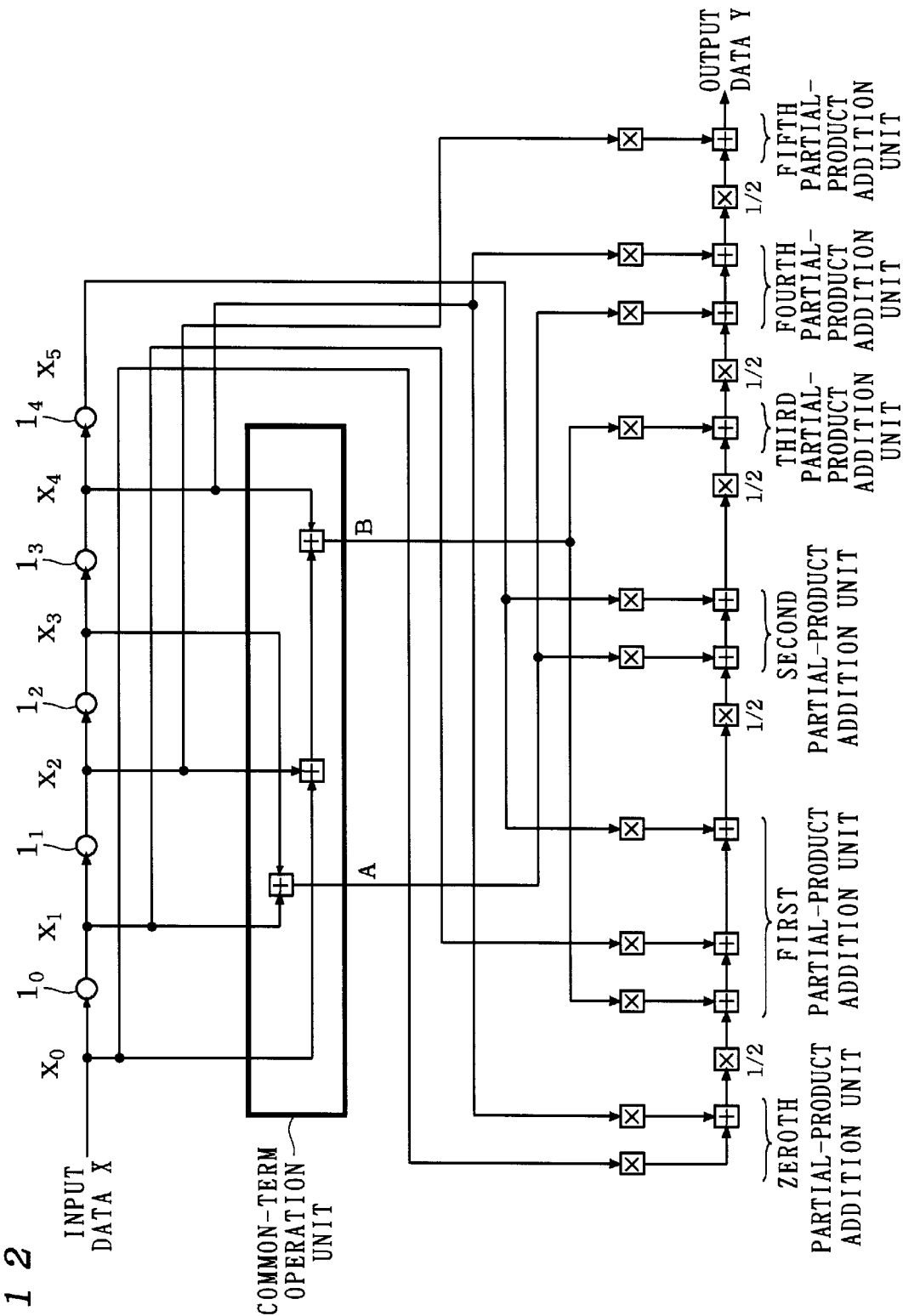
FIG. 12 is a detailed block diagram showing the configuration of the filter circuit in accordance with the fifth preferred embodiment of the present invention.

For example, FIG. 12 shows a revised version of FIG. 11 according to Formula 7. An output from the common-term operation unit that corresponds to the intermediate variable A is inputted to the second and fourth partial-product addition units and an output from the common-term operation unit that corresponds to the intermediate variable B is inputted to the first and third partial-product addition units. It can be also found from FIG. 12 that the filter circuit consists of thirteen adders. As the filter coefficient is fixedly determined depending on coefficient of the transfer function, data to be inputted to adders in each partial-product addition unit can be selected in advance out of the sequentially-delayed input data X and outputs from the common-term operation unit. FIG. 12 shows multipliers other than those having a multiplier of ½ provided before the adders of each partial-product addition unit for the purpose of defining the multipliers having coefficient of "1" in contrast to the multipliers having coefficient of "0", and these multipliers may actually be omitted.

In the background-art bit plane structure, if the filter coefficient is fixedly determined, a multiplier corresponding to a bit whose coefficient is "0" in the transfer function and an adder having an input connected to the output of the multiplier can be removed in advance. In this case, however, assuming that the number of bits whose coefficient is "1" in transfer function is S, the filter circuit must include (S−1) adders.

In contrast, the filter circuit of the fifth preferred embodiment shown in FIG. 11 consists of only (S−1−D) adders. D is expressed as below in Formula 8:

$$\sum_{a=1}^{T}(D_a-1)(T_a-1)=D \quad (8)$$

where T, $D_a$ ($1 \leq a \leq T$) and $T_a$ represent the number of common terms, duplication rate of each common term and the number of terms in a common term, respectively.

Therefore, a filter circuit having the same characteristic features as the background-art bit plane structure can be achieved with a smaller number of adders. That results in reduction in circuit scale of the filter circuit.

The Sixth Preferred Embodiment

First considered is a filtering operation as expressed in Formula 9:

$$Y=\frac{15}{128}X_0+\frac{7}{32}X_1+\frac{9}{128}X_2+\frac{23}{128}X_3+ \quad (9)$$

$$\frac{21}{64}X_4+\frac{11}{128}X_5=\left(\frac{1}{128}+\frac{1}{64}+\frac{1}{32}+\frac{1}{16}\right)X_0+$$

$$\left(\frac{1}{32}+\frac{1}{16}+\frac{1}{8}\right)X_1+\left(\frac{1}{128}+\frac{1}{16}\right)X_2+$$

$$\left(\frac{1}{128}+\frac{1}{64}+\frac{1}{32}+\frac{1}{8}\right)X_3+\left(\frac{1}{64}+\frac{1}{16}+\frac{1}{4}\right)X_4+$$

$$\left(\frac{1}{128}+\frac{1}{64}+\frac{1}{16}\right)X_5$$

Formula 9 may be modified into Formula 10 as below:

$$Y=\frac{1}{4}X_4+\frac{1}{16}(X_0+X_1+X_2+X_4+X_5)+ \quad (10)$$

$$\frac{1}{32}(X_0+X_1+X_3)+\frac{1}{64}(X_0+X_3+X_4+X_5)+$$

$$\frac{1}{128}(X_0+X_2+X_3+X_5)$$

The terms $(X_0+X_3)$ and $(X_0+X_4+X_5)$ repeatedly appear in Formula 10 as common terms. In comparison between Formulae 6 and 10, it is found that the common term varies with the difference of the coefficient of the terms $X_0$ to $X_5$, i.e., the difference in the filter characteristics.

Assuming $P=X_0+X_3$ and $Q=X_0+X_4+X_5$, Formula 10 may be modified into Formula 11 as below:

$$Y=\frac{1}{4}X_4+\frac{1}{16}(Q+X_1+X_2)+ \quad (11)$$

$$\frac{1}{32}(P+X_1)+\frac{1}{64}(Q+X_3)+\frac{1}{128}(P+X_2+X_5)$$

Based on the above, the sixth preferred embodiment will be now discussed. Applying the technique of the fifth preferred embodiment to the filter circuit included in the digital-signal processing circuit of FIG. 16 allows reduction in the number of adders in the filter circuit. However, there arises a need for providing a common-term operation unit for each filter circuit when the digital-signal processing circuit of FIG. 16 consisting of the independently-formed filter circuits F1 to FL adopts the technique of the fifth preferred embodiment because the common term varies with the difference in the filter characteristics as discussed above.

The sixth preferred embodiment is intended to achieve the above with one common-term operation unit, to further reduce the number of adders and achieve a smaller-scaled digital-signal processing circuit.

Figure 13:
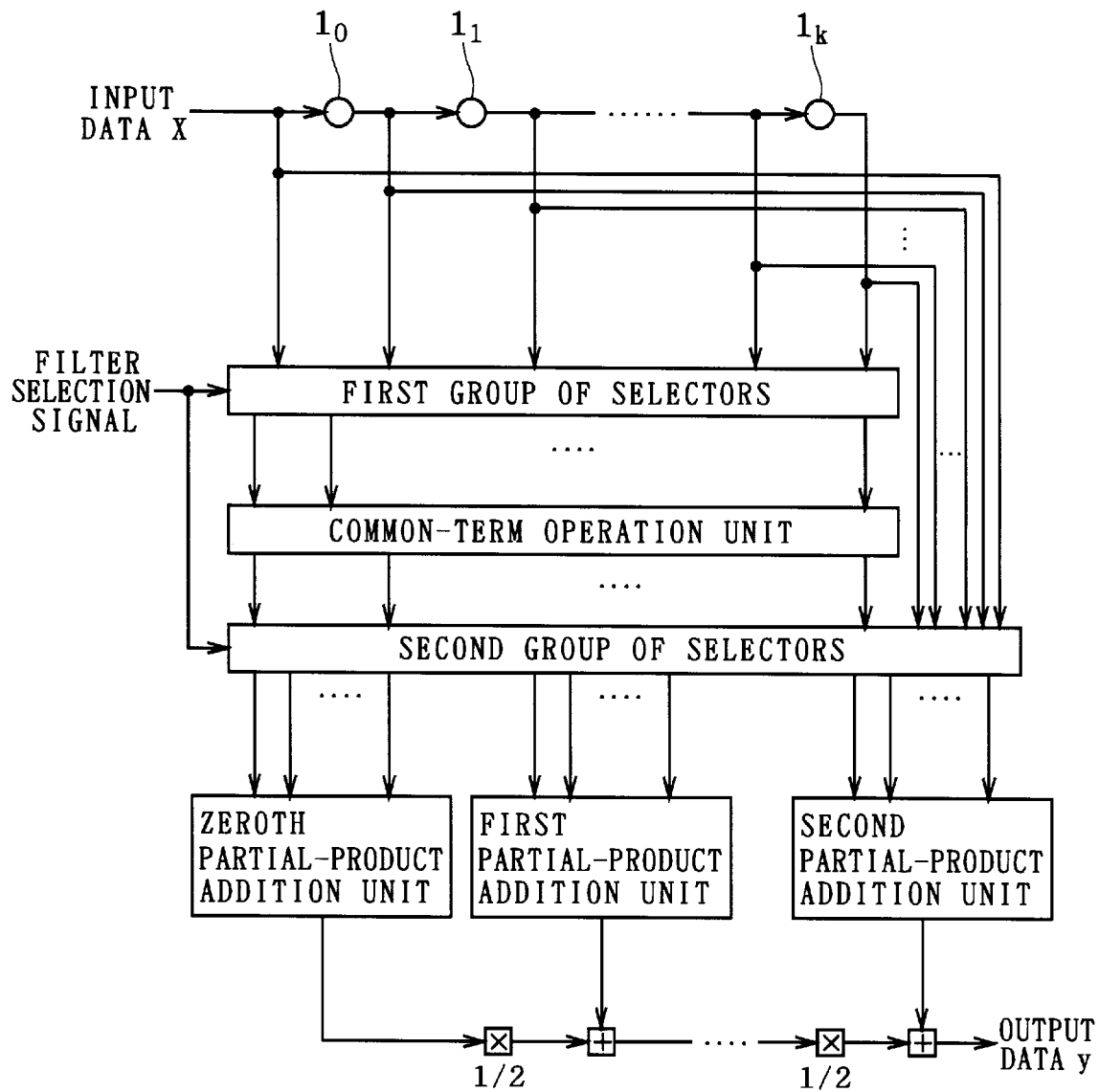
FIG. 13 is a block diagram showing a configuration of a digital-signal processing circuit in accordance with a sixth preferred embodiment of the present invention.

A configuration of the digital-signal processing circuit of the sixth preferred embodiment is shown in FIG. 13. The input data X are sequentially delayed by the delay elements $1_0$ to $1_k$ and inputted to a first group of selectors. The first group of selectors also receive a filter selection signal. Specifically, data to be inputted to the common-term operation unit are selected in response to the filter selection signal applied to the first group of selectors as the common term varies with the selected one out of the filter circuits F1 to FL.

The common-term operation unit performs addition on the common term to obtain an intermediate variable like in the fifth preferred embodiment, and outputs the addition result to a second group of selectors. The second group of selectors also receive the input data X sequentially delayed by the delay elements $1_0$ to $1_k$. The second group of selectors further receive the filter selection signal, and select data to be inputted to a bit plane out of the outputs from the common-term operation unit and the sequentially-delayed input data X, depending on the selected filter circuit in accordance with the filter selection signal. Through the following multiply-add operation in each bit plane as performed in the first to fourth preferred embodiments, the output data y of the digital-signal processing circuit can be obtained.

Figure 15:
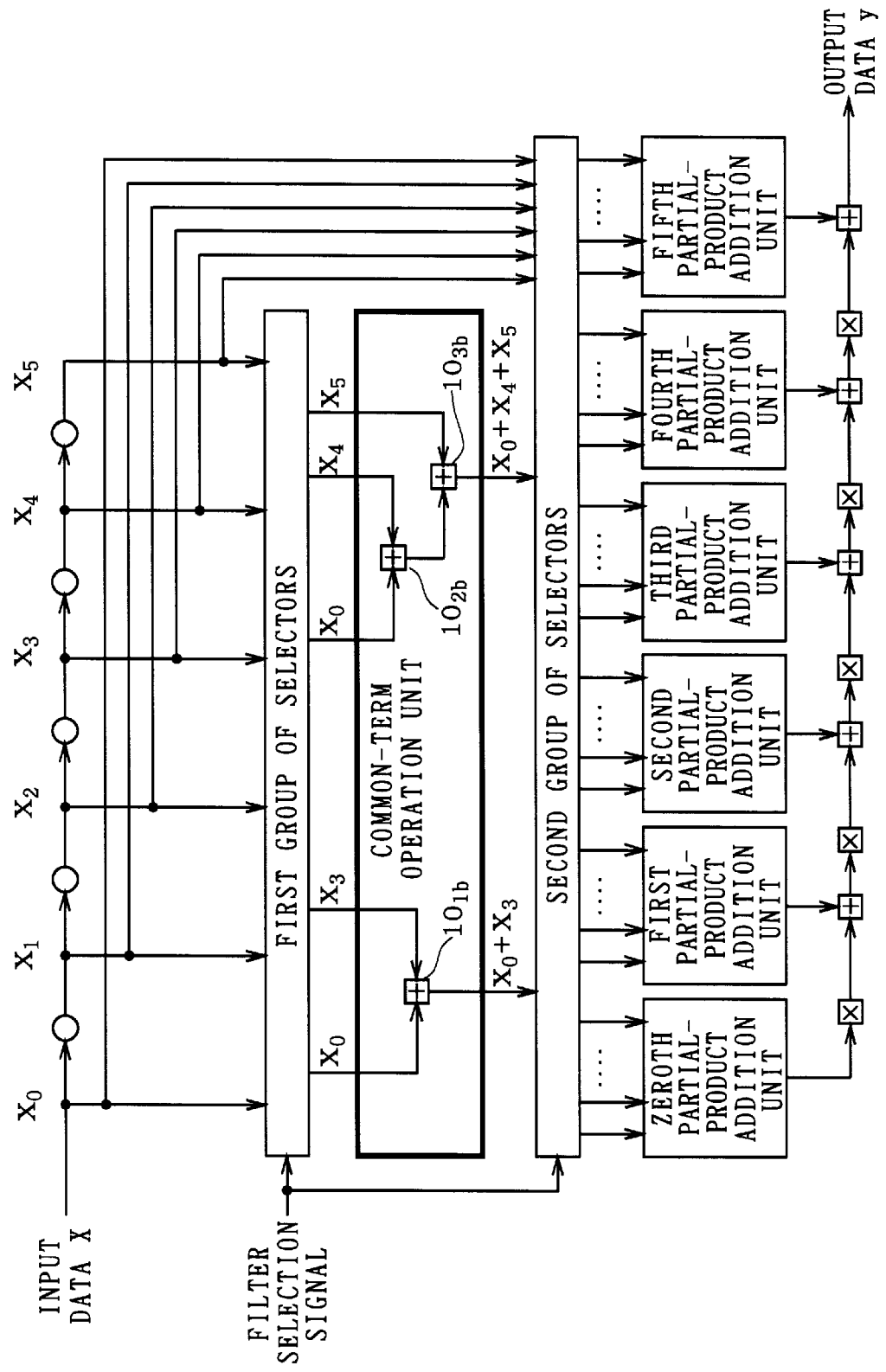
FIG. 15 is a block diagram showing still another configuration of a digital-signal processing circuit in accordance with the sixth preferred embodiment of the present invention.

For example, FIGS. 14 and 15 show revised versions of FIG. 13 according to Formulae 7 and 11, respectively. The common-term operation unit of FIG. 14 consists of adders $10_{1a}$, $10_{2a}$ and $10_{3a}$, and that of FIG. 15 consists of adders $10_{1b}$, $10_{2b}$ and $10_{3b}$. The common-term operation units of FIGS. 14 and 15 are equivalent in being constituted of three adders.

However, the adders $10_{1a}$ to $10_{3a}$ in the common-term operation unit of FIG. 14 and the adders $10_{1b}$ to $10_{3b}$ in the common-term operation unit of FIG. 15 receive different input data. Specifically, the adder $10_{1a}$ receives the terms $X_1$ and $X_3$, while the adder $10_{1b}$ receives the terms $X_0$ and $X_3$. The adder $10_{2a}$ receives the terms $X_0$ and $X_2$, while the adder $10_{2b}$ receives the terms $X_0$ and $X_4$. The adder $10_{3a}$ receives the term $(X_0+X_2)$ outputted from the adder $10_{2a}$ and the term $X_4$, while the adder $10_{3b}$ receives the term $(X_0+X_4)$ outputtedfrom the adder $10_{2b}$ and the term $X_5$.

Thus, though these common-term operation units each consist of the same number of adders, the respective adders receive different input data depending on the selected filter coefficient. For this reason, in the sixth preferred embodiment, the first group of selectors for selecting data to be inputted to an adder in response to the filter selection signal are provided before the input data X are inputted to the common-term operation unit.

Further, in the sixth preferred embodiment, the outputs from the common-term operation unit and the appropriately-delayed input data X are inputted to the partial-product addition units through the second group of selectors. Specifically, data to be inputted to a bit plane is selected depending on the characteristic of the filter circuit that the filter selection signal indicates in the second group of selectors as data to be inputted to a partial-product addition unit vary with the selected filter coefficient, as discussed in the fifth preferred embodiment.

Figure 16:
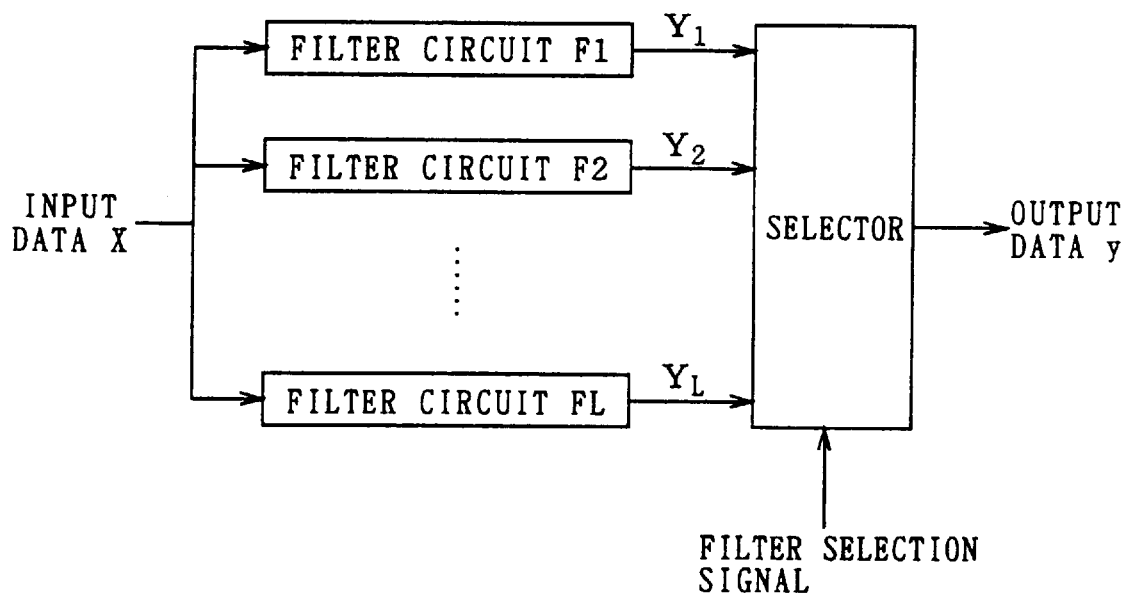
FIG. 16 is a block diagram showing a configuration of a digital-signal processing circuit in the background art.

In the digital-signal processing circuit of FIG. 16, if the filter coefficient is fixedly determined, a multiplier corresponding to a bit whose coefficient is "0" in the transfer function and an adder having an input connected to the output of the multiplier can be removed in advance. In this case, however, assuming that the number of bits whose coefficient is "1" in transfer function is $S_z$ in a filter circuit FZ ($1 \leq Z \leq L$), the filter circuit FZ must include ($S_z-1$) adders. Accordingly, the digital-signal processing circuit needs K adders on the whole. K is expressed in Formula 12 as below:

$$\sum_{z=1}^{L} (S_z - 1) = K \quad (12)$$

In contrast, the digital-signal processing circuit of the sixth preferred embodiment shown in FIG. 13 consists of $\max(S_z-1-D_z)$ adders through the filter circuits F1 to FL. $D_z$ is expressed as below in Formula 13:

$$\sum_{W=1}^{N_Z} (D_{W,Z} - 1)(T_{W,Z} - 1) = D_Z \quad (13)$$

where $T_{w,z}$ ($1 \leq W \leq T_z$), $D_{w,z}$ and $N_z$ represent the number of common terms, duplication rate of each common term and the number of common terms in each filter circuit, respectively.

Therefore, a filter circuit having the same characteristic features as the background-art bit plane structure can be achieved with a smaller number of adders. That results in reduction in circuit scale of the digital-signal processing circuit.

While the invention has been shown and described in detail, the foregoing description is in all aspects illustrative and not restrictive. It is therefore understood that numerous modifications and variations can be devised without departing from the scope of the invention.

We claim:

1. A filter circuit having (n+1) filter coefficients, $C_i$, each of which is a base R number and constituted of coefficient components $C_i^j$ ranging from $C_i^0$ for the least significant bit to $C_i^m$ (i, j, n, m: integer, $0 \leq i \leq n$, $0 \leq j \leq m$), comprising:
   a structure of cascade connection of zeroth to m-th bit planes with a multiplier of 1/R interposed;
   wherein a j-th bit plane has:
      zeroth to n-th multipliers for multiplying input data to be processed in said filter circuit by said coefficient components $C_0^j$ to $C_n^j$, respectively; and
      n delay elements and n adders for performing accumulation of outputs of said n-th to zeroth multipliers while sequentially delaying the same in this order, wherein an output of a last one of said adders in a sequence of said adders in said j-th bit plane constitutes an output of said j-th bit plane; and
   wherein said multiplier of 1/R multiplies an output of a (s−1) bit plane (s: integer, $1 \leq s \leq m$) by a predetermined coefficient to produce a multiplication result, wherein another adder adds this multiplication result together with an output from a t-th multiplier (t: integer, $0 \leq t \leq (n-1)$) in an s-th bit plane.

2. The filter circuit of claim 1, wherein said another adder adds the multiplication result to an output of said s-th bit plane.

3. A filter circuit having (n+1) filter coefficients $C_i$ each of which is a base R number and constituted of coefficient components $C_i^j$ ranging from $C_i^0$ for the least significant bit to $C_i^m$ (i, j, n, m: integer, $0 \leq i \leq n$, $0 \leq j \leq m$), comprising:
   a structure of cascade connection of zeroth to m-th bit planes with a multiplier of 1/R interposed;

wherein a j-th bit plane has:
  zeroth to n-th multipliers for multiplying input data to be inputted thereto by said coefficient components $C_0^j$ to $C_n^j$, respectively; and
  n adders for performing accumulation of outputs of said zeroth to n-th multipliers to produce a final output;
  wherein said input data are inputted to said zeroth multiplier in said j-th bit plane through Nj delay elements (N: integer, $0 \leq N$),
  said input data are inputted to an h-th multiplier (h: integer, $1 \leq h \leq n$) in said j-th bit plane through ((M+1)h+Nj) delay elements (M: integer, $0 \leq M$),
  and an output of a (h−1)-th multiplier is delayed by M delay elements and added to an output of said h-th multiplier to achieve said accumulation using said adders.

4. The filter circuit of claim 3, wherein M=1 and N=0.

5. The filter circuit of claim 4, wherein; said cascade connection is made of:
  K delay elements (K: integer, $0 \leq K$) for delaying an output of a (s−1) bit plane (s: integer, $1 \leq s \leq m$) to be transferred to said multiplier of 1/R;
  an adder for adding said output of said (s−1) bit plane through said K delay elements and said multiplier of 1/R to an output of an s-th bit plane; and
  jK delay elements interposed between said adder and said output of said s-th bit plane.

6. The filter circuit of claim 3, wherein M=1 and N=1.

7. The filter circuit of claim 3, wherein;
M=0 and N=0;
  said n adders form a tree-structure with a plurality of stages;
  said final output of said j-th bit plane is an output from a single adder located at a last stage of said tree-structure among said n adders; and
  a branch of said tree-structure has at least one delay element.

8. The filter circuit of claim 7, wherein:
  said cascade connection is made of:
    K delay elements (K: integer, $0 \leq K$) for delaying an output of a (s−1) bit plane (s: integer, $1 \leq s \leq m$) to be transferred to said multiplier of 1/R;
    an adder for adding said output of said (s−1) bit plane through said K delay elements and said multiplier of 1/R to an output of an s-th bit plane; and
    jK delay elements interposed between said adder and said output of said s-th bit plane.

9. A filter circuit which obtains the sum from i=0 to n $\Sigma$ $C_i^j X_i 2^{j+k}$ (i, j, k, n, m: integer, $0 \leq i \leq n$, $0 \leq j \leq m$) that includes a partial product $P_j$ from coefficient components $C_i^j$ each of "0" or "1" constituting a binary filter coefficient $C_i$ from the least significant bit and delayed input data $X_i$ including input data $X_0$ and sequentially-delayed ones of said input data $X_0$, and further calculates the sum from i=0 to n $\Sigma$ $C_i X_i$ that is the sum from j=0 to m of said partial product $P_j$ to be outputted, comprising:
  a common-term operation unit for obtaining an intermediate variable that is the sum from q=0 to n of said delayed input data $X_q$ (where q is an integer, the sum being an accumulation of at least two numbers of q when a plurality of said coefficient components $C_q^i$ are "1" in said partial product $P_j$;
  a j-th bit plane for calculating said partial product $P_j$ using said intermediate variable; and
  an s-th operator obtaining a result of multiplying an output of a (s−1)-th bit plane (s: integer, $1 \leq s \leq m$) by ½ to output the result to an s-th bit plane.

10. The filter circuit of claim 9, wherein:
  said filter circuit has a plurality of said filter coefficients $C_i$, one of which is selected in response to a filter selection signal, for representing a plurality of filter characteristics;
  said filter circuit further comprising:
  a first selector for selectively outputting said delayed input data $X_i$ to said common-term operation unit in response to said filter selection signal, to obtain, using said common-term operation unit, said intermediate variable in accordance with one of said plurality of filter characteristics; and
  a second selector for selectively outputting an output of said common-term operation unit and said delayed input data $X_i$ to said j-th bit plane, to obtain, using said i-th bit plane, said partial product $P_j$ in accordance with one of said plurality of filter characteristics.

11. A filter circuit which obtains a sum from i=0 to n $\Sigma$ $C_i X_i$ (i, n: integer, $0 \leq i \leq n$), wherein $X_1$ to $X_n$ are sequentially-delayed values of an input data value $X_0$, and $C_i$ is a sum from j=0 to m $\Sigma$ $C_i^j 2^{j+k}$ (j, k, m: integer, $0 \leq j \leq m$), $C_i^j$ being a coefficient of $X_i$ with respect to j and taking a value "0" or "1," said filter circuit comprising:
  a plurality of bit planes provided corresponding to different ones among 0 to m, each for performing an operation including a sum of one or more values of $X_0$ to $X_n$, each coefficient of the one or more values with respect to the corresponding one among 0 to m taking "1, " wherein the sums performed by at least two of said bit planes include sums of plural common values of $X_0$ to $X_n$; and
  a common-term operation unit for calculating an intermediate variable that is a sum of said plural common values,
  said at least two bit planes obtaining the respective sums using said intermediate variable.

12. The filter circuit of claim 11, further comprising:
  a first selector for selectively outputting $X_0$ to $X_n$ to said common-term operation unit as said at least two common values in response to a filter selection signal; and
  a second selector for selectively outputting an output of said common-term operation unit and $X_0$ to $X_n$ to said plurality of bit planes in response to said filter selection signal.

13. The filter circuit of claim 11, wherein:
  each of said bit planes except one among said plurality of bit planes performs a sum of the one or more values of $X_0$ to $X_n$ and another value, said another value being a product of a power of 2 by a result of the operation performed by another bit plane among said plurality of bit planes.

* * * * *